US009847321B2

(12) United States Patent
Hamada

(10) Patent No.: US 9,847,321 B2
(45) Date of Patent: Dec. 19, 2017

(54) SEMICONDUCTOR DEVICE AND CONTROL METHOD FOR THE SAME

(71) Applicant: FUJITSU LIMITED, Kawasaki-shi, Kanagawa (JP)

(72) Inventor: Yusuke Hamada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/255,173

(22) Filed: Sep. 2, 2016

(65) Prior Publication Data
US 2017/0077066 A1    Mar. 16, 2017

(30) Foreign Application Priority Data

Sep. 10, 2015   (JP) ................... 2015-178099

(51) Int. Cl.
*H01L 25/00*   (2006.01)
*H01L 25/065*  (2006.01)
(Continued)

(52) U.S. Cl.
CPC ........... *H01L 25/0657* (2013.01); *H03K 5/24* (2013.01); *H01L 24/05* (2013.01); *H01L 24/06* (2013.01); *H01L 24/13* (2013.01); *H01L 24/16* (2013.01); *H01L 24/17* (2013.01); *H01L 2224/0401* (2013.01); *H01L 2224/0557* (2013.01); *H01L 2224/05568* (2013.01); *H01L 2224/06181* (2013.01); *H01L 2224/131* (2013.01); *H01L 2224/13025* (2013.01); *H01L 2224/16146* (2013.01); *H01L 2224/16148* (2013.01); *H01L 2224/16227* (2013.01);
(Continued)

(58) Field of Classification Search
None
See application file for complete search history.

(56) References Cited

U.S. PATENT DOCUMENTS 7,046,522 B2 * 5/2006 Sung ................... H01L 25/0657
                                              174/262
9,496,042 B1 * 11/2016 Abiko .................... G11C 16/10
(Continued)

FOREIGN PATENT DOCUMENTS

| JP | 2000-227457 | 8/2000 |
| JP | 2012-235114 | 11/2012 |
| WO | 2012169168 | 12/2012 |

*Primary Examiner* — Lincoln Donovan
*Assistant Examiner* — Khareem E Almo
(74) *Attorney, Agent, or Firm* — Fujitsu Patent Center

(57) ABSTRACT

A semiconductor device includes: a first semiconductor chip including a first terminal at a first face side, a first load whose one end is connected to the first terminal, another end of the first load being to be connected to a power source potential, a second terminal at a second face side, a second load whose one end is connected to the second terminal, another end of the second load being to be connected to a ground potential, a first detection circuit that detects generation of potential difference at the first load, and a second detection circuit that detects generation of potential difference at the second load; and a second semiconductor chip including a connection terminal disposed at a face facing the first semiconductor chip; wherein the power source potential or the ground potential is to be connected through the connection terminal to the first or second terminal.

9 Claims, 19 Drawing Sheets

(51) Int. Cl.
*H03K 5/24* (2006.01)
*H01L 23/00* (2006.01)
(52) U.S. Cl.
CPC ............ *H01L 2224/17181* (2013.01); *H01L 2225/06513* (2013.01); *H01L 2225/06541* (2013.01); *H01L 2225/06565* (2013.01)

(56) References Cited

U.S. PATENT DOCUMENTS

| | | |
|---|---|---|
| 2002/0020904 A1 | 2/2002 | Hikita et al. |
| 2008/0067325 A1* | 3/2008 | Tani ................ H04N 3/1512 250/208.1 |
| 2010/0079195 A1* | 4/2010 | Sahin ................ H03K 17/08 327/427 |
| 2012/0274348 A1 | 11/2012 | Shin et al. |
| 2013/0135004 A1 | 5/2013 | Hashimoto et al. |
| 2013/0335127 A1* | 12/2013 | Kim .................... H03K 3/012 327/198 |
| 2015/0381161 A1* | 12/2015 | Zhang ................ H03K 17/161 327/109 |
| 2017/0077066 A1* | 3/2017 | Hamada ............. H01L 25/0657 |
| 2017/0125085 A1* | 5/2017 | Kim .................... G11C 5/14 |

* cited by examiner

OUTPUTS OF THE FIRST AND SECOND DETECTOR CIRCUITS

| CHIP-STACKING TOPOLOGY | F2F | B2F |
|---|---|---|
| OUTPUT OF THE FIRST DETECTOR CIRCUIT | Low | Low |
| OUTPUT OF THE SECOND DETECTOR CIRCUIT | Low | High |

FIG. 20A

OUTPUTS OF THE FIRST AND SECOND DETECTOR CIRCUITS

| CHIP-STACKING TOPOLOGY | F2F | B2F | F2B | B2B |
|---|---|---|---|---|
| OUTPUT OF THE FIRST DETECTOR CIRCUIT | Low | Low | High | Low |
| OUTPUT OF THE SECOND DETECTOR CIRCUIT | Low | High | Low | Low |

FIG. 20B

OUTPUTS OF THE THIRD AND FOURTH DETECTOR CIRCUITS

| CHIP-STACKING TOPOLOGY | F2F | B2F | F2B | B2B |
|---|---|---|---|---|
| OUTPUT OF THE THIRD DETECTOR CIRCUIT | Low | High | Low | Low |
| OUTPUT OF THE FOURTH DETECTOR CIRCUIT | Low | Low | High | Low |

SEMICONDUCTOR DEVICE AND CONTROL METHOD FOR THE SAME

CROSS-REFERENCE TO RELATED APPLICATION

This application is based upon and claims the benefit of priority of the prior Japanese Patent Application No. 2015-178099, filed on Sep. 10, 2015, the entire contents of which are incorporated herein by reference.

FIELD

The embodiments discussed herein related to a semiconductor device and control method for a semiconductor device.

BACKGROUND

A 3D-LSI (three-dimensional large-scale integration), in which a plurality of semiconductor chips are stacked, has been developed to enhance the integration of an integrated circuit (for example, refer to Japanese laid-open Patent Publication No. 2012-235114, Japanese laid-open Patent Publication No. 2000-227457 and International Publication Pamphlet No. WO 2012/169168).

SUMMARY

According to an aspect of the embodiments, a semiconductor device includes: a first semiconductor chip including a first terminal disposed at a first face side having a first face, a first load whose one end is connected to the first terminal, another end of the first load being to be connected to a power source potential, a second terminal disposed at a second face side having a second face so as to face the first terminal, the second face being on an side opposite to the first face, a second load whose one end is connected to the second terminal, another end of the second load being to be connected to a ground potential different from the power source potential, a first detection circuit that detects generation of a first potential difference at the first load, and a second detection circuit that detects generation of a second potential difference at the second load; and a second semiconductor chip including a connection terminal disposed at a face side having a face and connected to the first terminal or the second terminal, the face facing the first semiconductor chip; wherein the power source potential or the ground potential is to be connected through the connection terminal to the first terminal or the second terminal; wherein the first potential difference is a potential difference generated at the first load when the first terminal is connected to a potential different from the power source potential, and the second potential difference is a potential difference generated at the second load when the second terminal is connected to a potential different from the ground potential.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 20A is a diagram illustrating a semiconductor device according to Embodiment 3; and FIG. 20B is a diagram illustrating a semiconductor device according to Embodiment 3.

DESCRIPTION OF EMBODIMENTS

Figure 1:
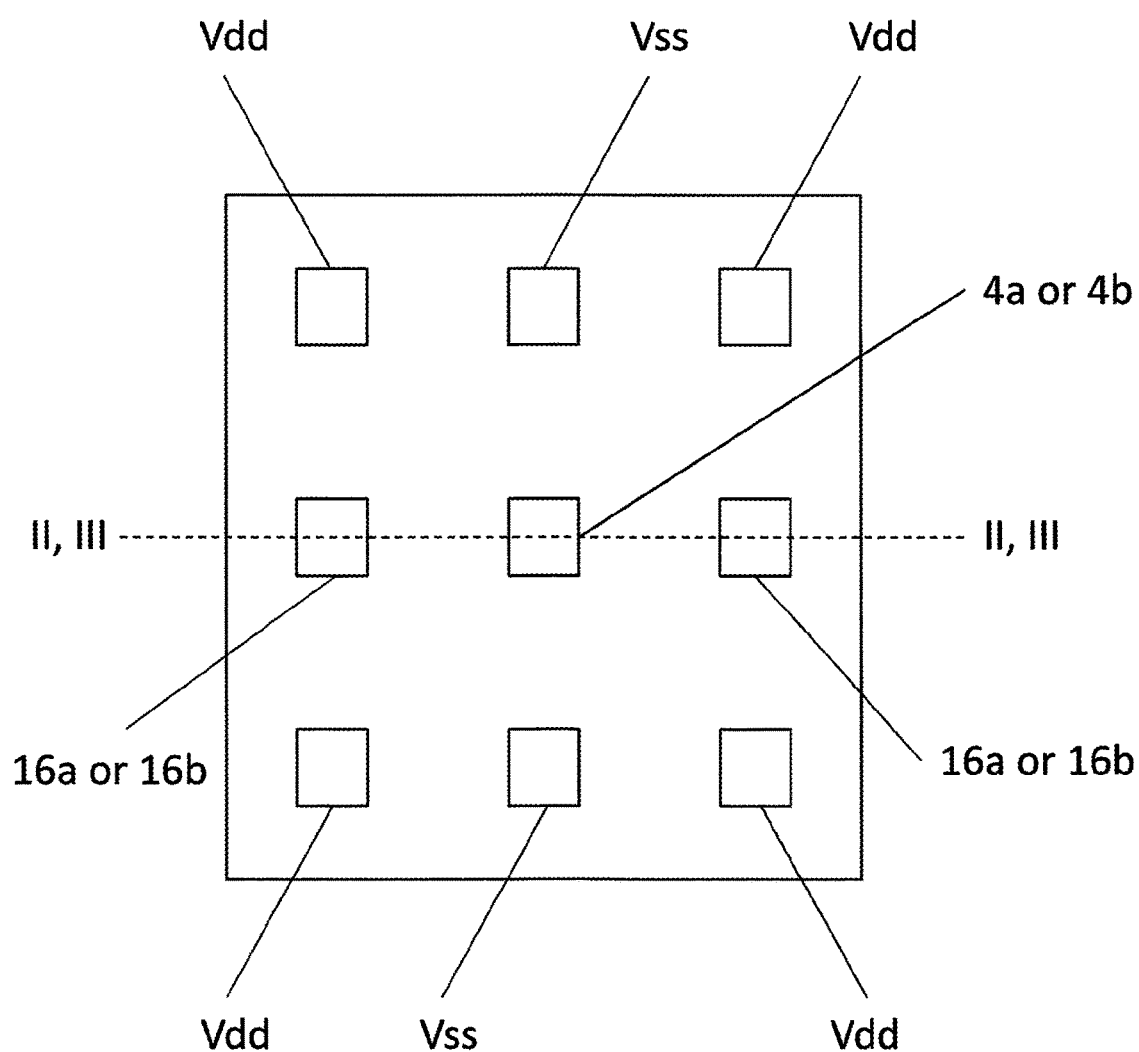
FIG. 1 is a top plan view of each semiconductor device according to Embodiment 1.

Preferred embodiments will be explained with reference to accompanying drawings. Here, identical symbols are given to corresponding parts even in different drawings, and the description thereof will be omitted.

As described previously, the 3D-LSI has been developed to enhance the integration of an integrated circuit.

The 3D-LSI, which is a semiconductor device mounted in a three-dimensional manner, is classified into four types, namely, F2F (face to face), F2B (face to back), B2F (back to face) and B2B (back to back) according to each chip-stacking topology.

The F2F is a chip-stacking topology in which the surfaces (faces on which integrated circuits are disposed) of semiconductor chips face each other. The F2B and the B2F are chip-stacking topologies in which the surface of one semiconductor chip faces the back surface (a face on the opposite side to the surface) of another semiconductor chip. The B2B is a chip-stacking topology in which the back surfaces of semiconductor chips face each other.

The characteristics of the 3D-LSI such as transmission speed of a signal exchanged between semiconductor chips, the upper limit of the number of terminals for the interconnection of the semiconductor chips, a minimum supply unit of power, heat dissipation characteristic, etc. vary depending on the difference of the chip-stacking topologies.

For example, it is easy to increase the number of conductive pads on the surface side of the semiconductor chip more than the number of TSV (through-silicon vias) on the back surface side. Accordingly, the upper limit of the number of terminals that interconnect the semiconductor chips is larger in the F2F, while smaller in the F2B, the B2F and the B2B. Further, a yield and man-hours in the manufacturing of the 3D-LSI vary according to the difference of the chip-stacking topologies.

Thus, the characteristics are evaluated for each chip-stacking topology in the development of the 3D-LSI to select an optimal chip-stacking topology. In this selection, the yield and the man-hours of each chip-stacking topology are also taken into account.

However, it is difficult to accurately evaluate the characteristics of the 3D-LSI unless the 3D-LSI is prototyped (i.e. experimentally produced) or simulated. Accordingly, semiconductor chips of different structures are prototyped or designed for each chip-stacking topology. Thus, a vast amount of man-hours occur in the development of the 3D-LSI.

Now, if the input/output terminals of the semiconductor chips can be freely changed according to the chip-stacking topology, it is not needed to prototype or design the semiconductor chips for each chip-stacking topology. However, in order to change the input/output terminals according to the chip-stacking topology, it is important to enable the semiconductor chips to detect their own chip-stacking topology.

According to the embodiments, there is provided a semiconductor device (3D-LSI) in which a semiconductor chip detects its own chip-stacking topology.

Embodiment 1

(1) Structure

Figure 2:
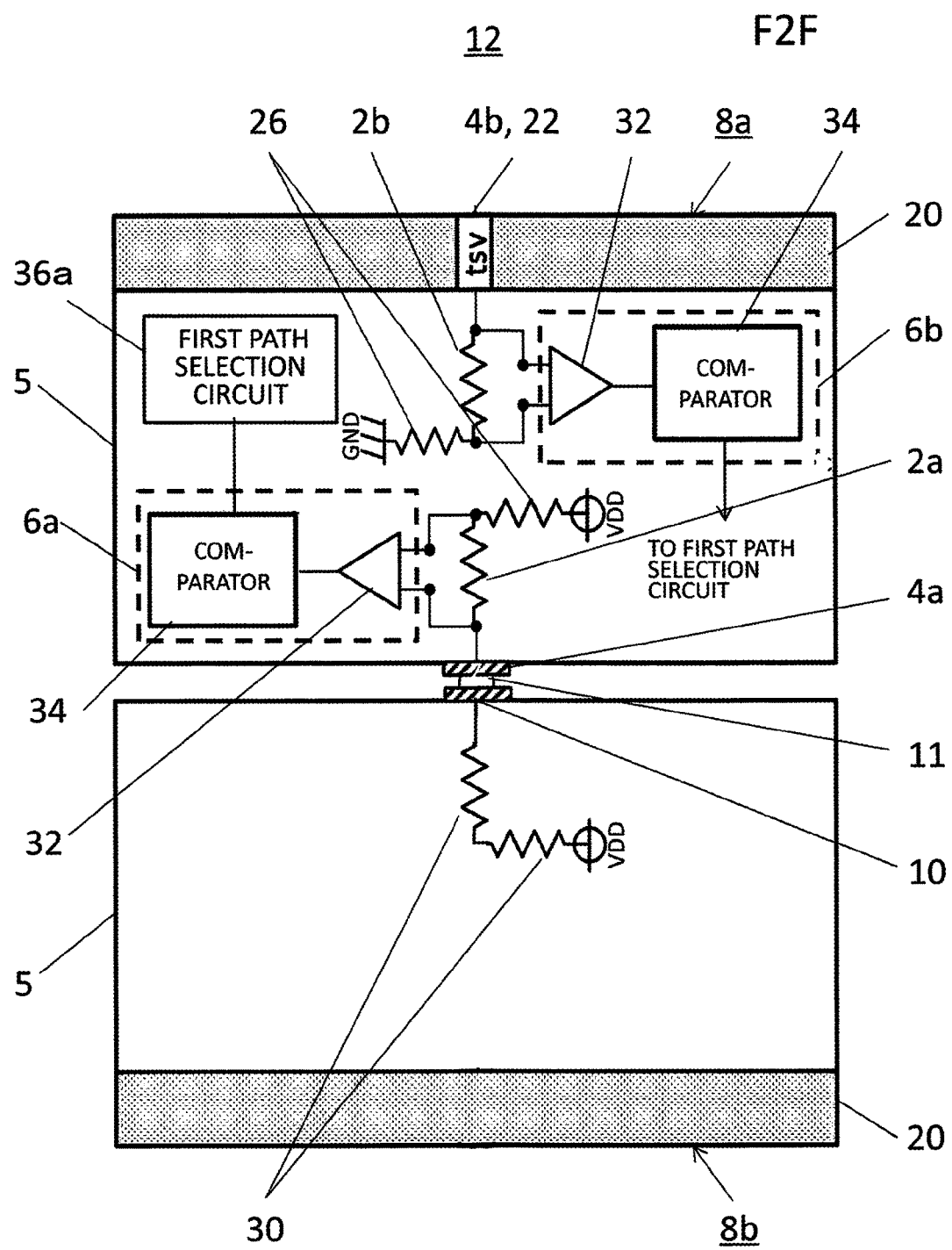
FIG. 2 is a sectional view of a F2F type semiconductor device along the II, III-II, III line depicted in FIG. 1.
Figure 3:
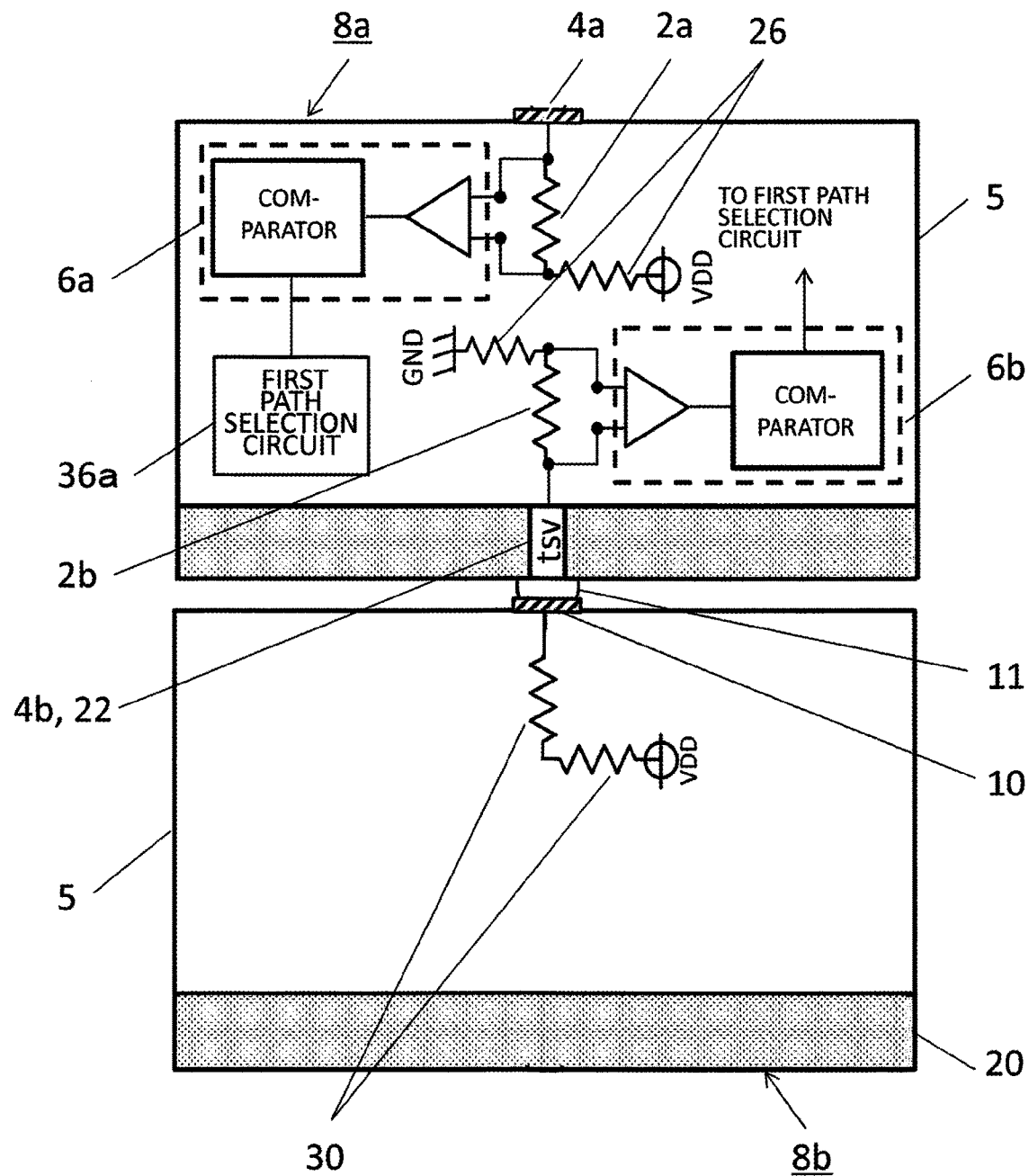
FIG. 3 is a sectional view of a B2F type semiconductor device along the II, III-II, III line depicted in FIG. 1.
Figure 4:
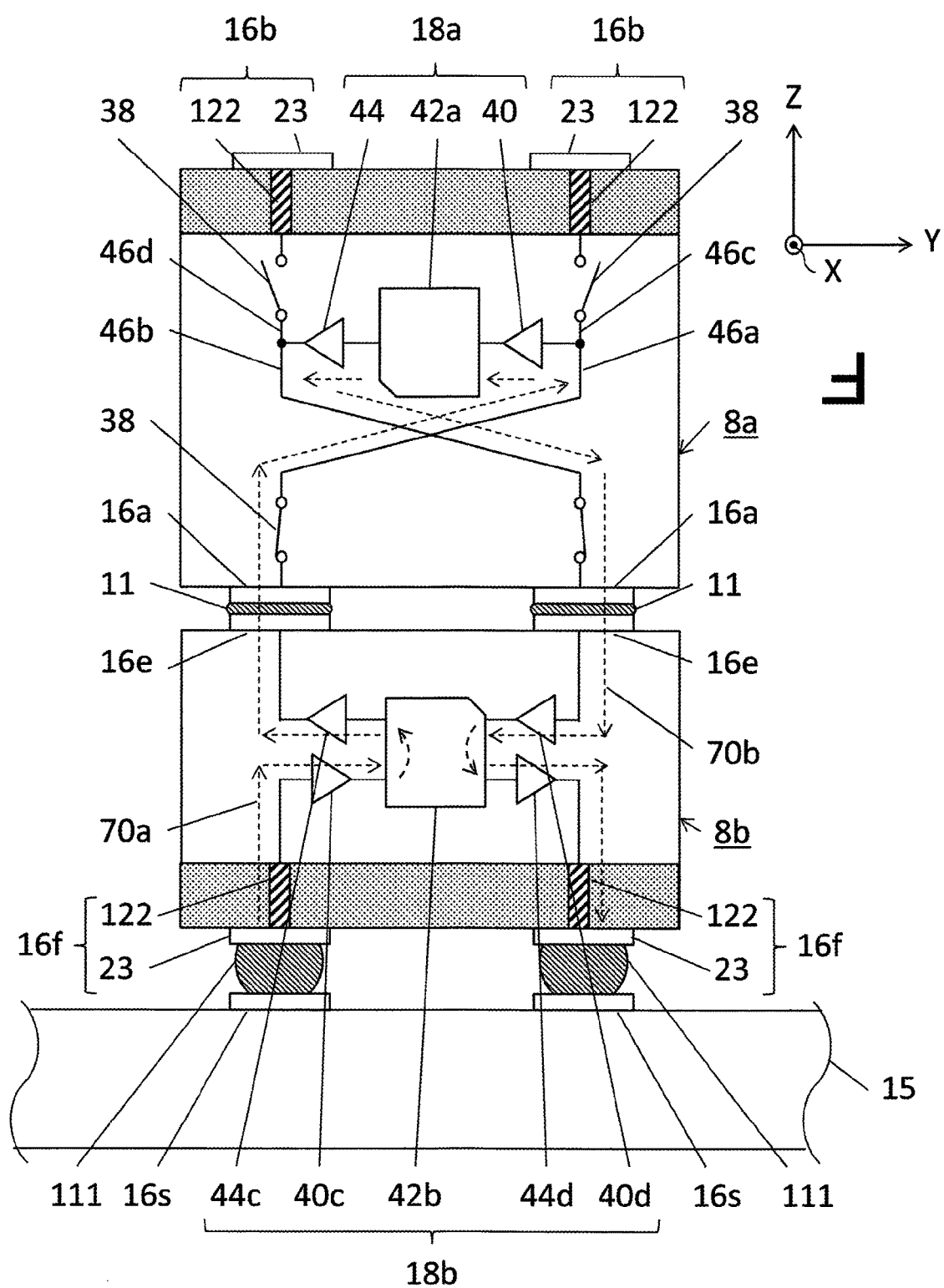
FIG. 4 is another sectional view of a F2F type semiconductor device along the II, III-II, III line depicted in FIG. 1.
Figure 5:
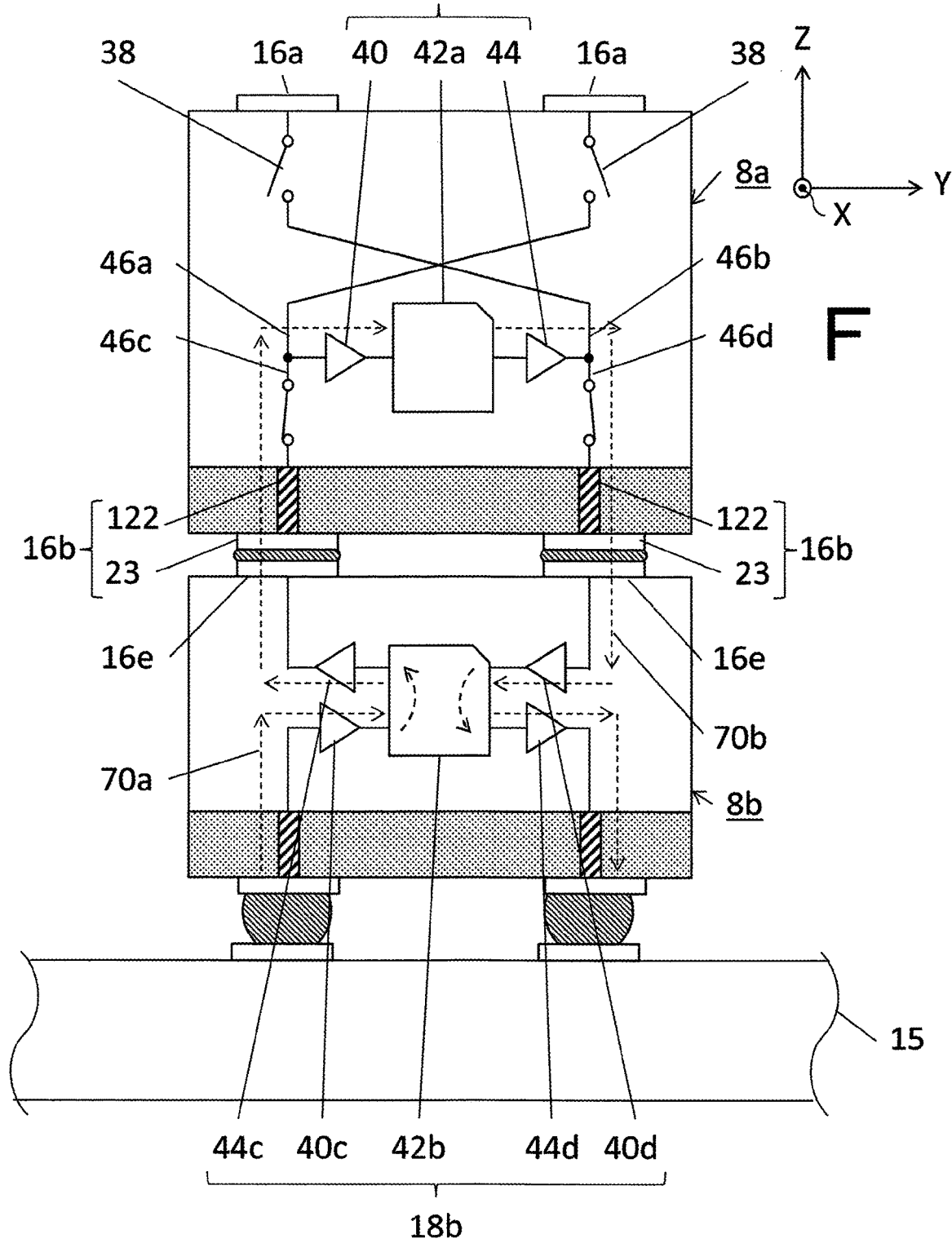
FIG. 5 is another sectional view of a B2F type semiconductor device along the II, III-II, III line depicted in FIG. 1.

FIG. 1 is a top plan view of each semiconductor device 12, 112 according to Embodiment 1. FIGS. 2 and 3 are sectional views along the II, III-II, III line depicted in FIG. 1. On the upper right parts of FIGS. 2 and 3, the chip-stacking topologies of the semiconductor devices 12, 112 are described (the same is applied to the sectional views hereinafter). FIGS. 4 and 5 are different sectional views along the II, III-II, III line depicted in FIG. 1.

Each semiconductor device 12, 112 according to Embodiment 1 is a 3D-LSI (the same is applied to Embodiments 2-3 also). The chip-stacking topologies of the semiconductor devices 12, 112 are F2F and B2F, respectively.

As depicted in FIGS. 2 and 3, each semiconductor device 12, 112 according to Embodiment 1 includes a first semiconductor chip 8a and a second semiconductor chip 8b. For example, each of the first semiconductor chip 8a and the second semiconductor chip 8b includes a semiconductor substrate 20 (for example, silicon substrate) and an integrated circuit formed on the surface side of the semiconductor substrate 20.

At each wiring layer 5 of FIGS. 2 and 3, depicted is a part of an integrated circuit of the semiconductor device 12, 112 (the same is applied to FIGS. 4 and 5 etc. described later). In FIGS. 4 and 5, depicted are other parts of the first semiconductor chip 8a and the second semiconductor chip 8b, the other parts being not depicted in FIGS. 2 and 3.

By the way, in FIGS. 2 and 3, first and second electrodes 16a, 16b (refer to FIG. 1) of the first semiconductor chip 8a are omitted (the same is applied to FIGS. 13 and 14 etc. described later). In FIGS. 4 and 5, a first terminal 4a and a second terminal 4b (refer to FIG. 1) are omitted (the same is applied to FIGS. 15-16 etc. described later).

—First Semiconductor Chip—

As depicted in FIGS. 2 and 3, the first semiconductor chip 8a includes a first terminal 4a disposed at a first face side (for example, surface side) having a first face, and a second terminal 4b disposed at a second face side (for example, back surface side) having a second face so as to face the first terminal 4a, the second face being opposite to the first face. The first terminal 4a is, for example, a conductive pad disposed at the surface of the wiring layer 5. The second terminal 4b is, for example, a TSV 22 provided in the semiconductor substrate 20. The second terminal 4b may include a conductive pad that covers the surface of the TSV 22 (the same as above in the following).

The first semiconductor chip 8a further includes a first load 2a and a second load 2b. One end of the first load 2a is connected to the first terminal 4a, while another end is to be connected to a power source potential VDD. In the examples depicted in FIGS. 2 and 3, the power source potential VDD is an output of a power supply to drive the first semiconductor chip 8a and the second semiconductor chip 8b (i.e. a power supply voltage).

One end of the second load 2b is connected to the second terminal 4b, while another end is to be connected to a ground potential GND, which is different from the power source potential VDD. In the examples depicted in FIGS. 2 and 3, the ground potential GND is a reference potential (i.e. the potential of a ground plane) of the integrated circuit disposed at the first semiconductor chip 8a and the integrated circuit disposed at the second semiconductor chip 8b. In other words, the ground potential GND is, for example, the potential on the ground side of the power supply mentioned above.

The first load 2a and the second load 2b are, for example, resistors, capacitors and diode-connected transistors (the same is applicable to a third load 2c and a fourth load 2d described later). Namely, the first load 2a is, for example, a pull-up resistor. The second load 2b is, for example, a pull-down resistor.

In the examples depicted in FIGS. 2 and 3, the first load 2a is to be connected to the power source potential VDD through a resistor 26. Similarly, the second load 2b is to be connected to the ground potential GND through another resistor 26. It is possible to omit the above resistors 26.

The first semiconductor chip 8a further includes a first detection circuit 6a. The first detection circuit 6a detects generation of a first potential difference at the first load 2a. The first potential difference is a potential difference generated at the first load 2a when the first terminal 4a is connected to, for example, the ground potential GND. In this case, the ground potential GND is connected to the first terminal 4a as a potential that is different from the power source potential VDD.

The first semiconductor chip 8a further includes a second detection circuit 6b. The second detection circuit 6b detects generation of a second potential difference at the second load 2b. The second potential difference is a potential difference generated at the second load 2b when the second terminal 4b is connected to, for example, the power source potential VDD. In this case, the power source potential VDD is connected to the second terminal 4b as a potential that is different from the ground potential GND.

Each of the first detection circuit 6a and the second detection circuit 6b includes a differential input preamplifier 32 (hereafter referred to as differential amplifier) and a comparator 34, for example. The differential amplifier 32 of the first detection circuit 6a amplifies a voltage between both ends of the first load 2a. The comparator 34 in the first detection circuit 6a compares an output of the differential amplifier 32 with a reference voltage. When the output of the differential amplifier 32 is greater than the reference voltage, the comparator 34 outputs a high level voltage (hereafter represented as High). When the output of the differential amplifier 32 is smaller than the reference voltage, the comparator 34 outputs a low level voltage (hereafter represented as Low). Similar operation is made in the differential amplifier 32 and the comparator 34 in the second detection circuit 6b.

The reference voltage of the first detection circuit 6a is, for example, half of a voltage that the differential amplifier 32 of the first detection circuit 6a outputs when it amplifies the first potential difference. The reference voltage of the second detection circuit 6b is, for example, half of a voltage that the differential amplifier 32 of the second detection circuit 6b outputs when it amplifies the second potential difference.

The first semiconductor chip 8a (refer to FIGS. 4 and 5) further includes a plurality of electrodes 16a, 16b, which are disposed at a first face (for example, the surface) and a second face (for example, the back surface), and a first internal circuit 18a to be connected to the plurality of electrodes 16a, 16b.

The first semiconductor chip 8a further includes a first path selection circuit 36a (refer to FIGS. 2 and 3). The first path selection circuit 36a selects an electrode to receive signal (i.e. a reception electrode) and an electrode to output signal (i.e. an output electrode) based on the output of the first detection circuit 6a and the output of the second detection circuit 6b, from among the plurality of electrodes 16a, 16b disposed at the first face and the second face, and the first path selection circuit 36a connects the selected electrodes (i.e. the reception electrode and the output electrode) to the first internal circuit 18a.

—Second Semiconductor Chip—

The second semiconductor chip 8b includes a connection terminal 10 disposed at a face side facing the first semiconductor chip 8a. The connection terminal 10 is connected to the first terminal 4a or the second terminal 4b.

In practice, when the chip-stacking topology is F2F (refer to FIG. 2), the connection terminal 10 is connected to a terminal provided on the surface side of the first semiconductor chip 8a (the first terminal 4a in FIG. 2). On the other hand, when the chip-stacking topology is B2F (refer to FIG. 3), the connection terminal 10 is connected to a terminal provided on the back surface side of the first semiconductor chip 8a (the second terminal 4b in FIG. 3). For example, the first terminal 4a or the second terminal 4b is connected to the connection terminal 10 through a solder bump 11 (for example, a micro-bump).

The second semiconductor chip 8b connects the first terminal 4a or the second terminal 4b of the first semiconductor chip 8a through the connection terminal 10 to the power source potential VDD or the ground potential GND. In the examples depicted in FIGS. 2 and 3, the second semiconductor chip 8b connects the first terminal 4a or the second terminal 4b to the power source potential VDD through an internal resistor 30 and the connection terminal 10. It is possible to omit the internal resistor 30.

In the examples depicted in FIGS. 2 and 3, the connection terminal 10 is provided on the surface side of the second semiconductor chip 8b. However, the connection terminal 10 may be provided on the back surface side of the second semiconductor chip 8b.

The second semiconductor chip 8b further includes a second internal circuit (not illustrated). The second internal circuit will be described later.

(2) Operation (2-1) Path Selection

FIGS. 4 and 5 are diagrams illustrating the selection of signal paths in the semiconductor devices 12, 112.

As depicted in FIGS. 1, 4 and 5, the first semiconductor chip 8a includes a plurality of first electrodes 16a disposed at a first face side (for example, the surface side) having a first face and a plurality of second electrodes 16b disposed at a second face side (for example, the back surface side) having a second face. In FIGS. 4 and 5, a circuit board 15 on which the semiconductor device 12, 112 are mounted is also illustrated (the same is applied to FIG. 8 etc. described later).

As described above, the first semiconductor chip 8a includes the first internal circuit 18a and the first path selection circuit 36a. The first internal circuit 18a includes, for example, an input part 40, a first signal processing circuit 42a and an output part 44. The input part 40 is, for example, an input buffer. The output part 44 is, for example, an output buffer.

The first signal processing circuit 42a is a CPU (central processing unit), a logic circuit, a memory, etc. (the same is applied to a second signal processing circuit 42b described later). The first path selection circuit 36a is, for example, a logic circuit or a CPU.

The first semiconductor chip 8a further includes a first path 46a that connects the input part 40 of the first internal circuit 18a to one of the plurality of first electrodes 16a. The first semiconductor chip 8a further includes a second path 46b that connects the output part 44 of the first internal circuit 18a to another first electrode 16a.

The first semiconductor chip 8a further includes a third path 46c that connects the input part 40 of the first internal circuit 18a to one of the plurality of second electrodes 16b. The first semiconductor chip 8a further includes a fourth path 46d that connects the output part 44 of the first internal circuit 18a to another second electrode 16b. Each of the first to fourth paths 46a-46d includes a wiring and a switch circuit 38 provided on the way of the wiring.

Each first electrode 16a is a conductive pad provided at the surface of the wiring layer 5, for example (the same is applied to each fifth electrode 16e etc. described later). Each second electrode 16b includes a TSV 122 provided at the semiconductor substrate 20, for example. As depicted in FIGS. 4 and 5, the second electrode 16b may include a conductive pad 23 that covers the surface of the TSV 122 (the same is applied to each sixth electrode 16f etc. described later).

Through a procedure described below, the first path selection circuit 36a connects the first internal circuit 18a to electrodes that face the second semiconductor chip 8b, based on the output of the first detection circuit 6a and the output of the second detection circuit 6b, the above electrodes being ones of the first electrodes 16a and the second electrodes 16b.

Additionally, an alphabet F depicted in FIG. 4 represents the posture of the first semiconductor chip 8a. The first semiconductor chip 8a depicted in FIG. 4 is obtained by rotating the first semiconductor chip 8a, whose semiconductor substrate is directed to the circuit board 15, by 180° around a coordinate axis X (an axis perpendicular to FIG. 4).

The alphabet F depicted in FIG. 4 is also obtained by rotating the F, whose lower side is directed to the circuit board 15, by 180° around the coordinate axis X. The same is applied to the alphabet F depicted in FIG. 5 etc. described later.

—Detection Circuit Output—

First, a description will be given on the outputs of the first detection circuit 6a and the second detection circuit 6b.

Figures 6, 7:
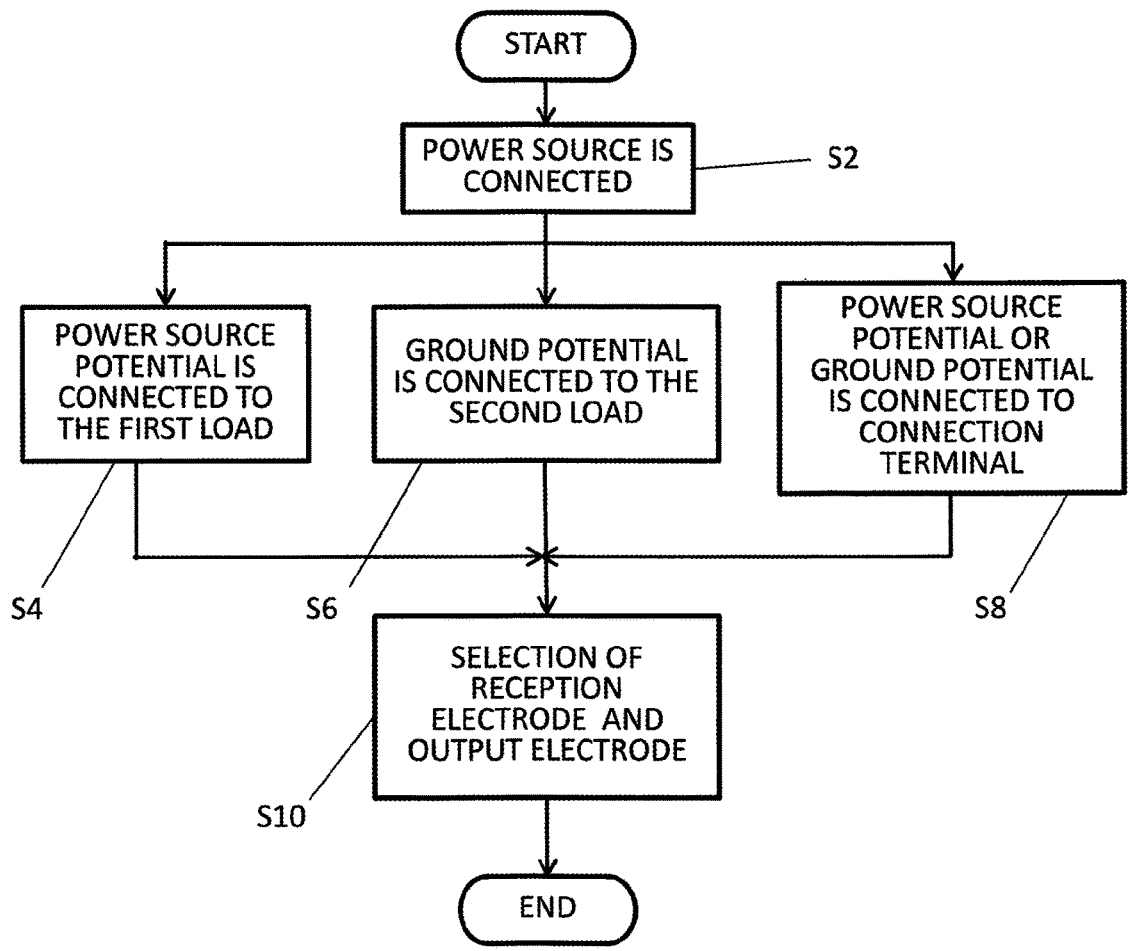
FIG. 6 is a diagram illustrating one example of each output of the first to second detection circuits depicted in FIGS. 2 and 3.
FIG. 7 is a flow chart illustrating a control method performed in the first semiconductor chip.

FIG. 6 is a diagram illustrating one example of outputs of the first to second detection circuits 6a, 6b depicted in FIGS. 2 and 3. In the first row of FIG. 6, each chip-stacking topology of the semiconductor device 12, 112 is indicated. In the second row of FIG. 6, each output of the first detector circuit 6a is indicated. In the third low of FIG. 6, each output of the second detector circuit 6b is indicated.

The chip-stacking topology of the semiconductor device 12 of FIG. 2 is F2F. In this semiconductor device 12, the power source potential VDD from the second semiconductor chip 8b is to be connected to one end of the first load 2a. On the other hand, the power source potential VDD from the inside of the first semiconductor chip 8a is to be connected to another end of the first load 2a. Accordingly, no potential difference is generated at the first load 2a. As a result, the output of the first detection circuit 6a becomes Low, as illustrated in the second row and the second column in FIG. 6.

In the semiconductor device 12 of FIG. 2, an end on the second terminal 4b side of the second load 2b is in a floating state in which no potential is connected thereto (so-called "floating"). Accordingly, no potential difference is generated on the second load 2b. As a result, the output of the second detection circuit 6b becomes Low, as illustrated in the third row and the second column in FIG. 6.

The chip-stacking topology of the semiconductor device 112 of FIG. 3 is B2F. In the semiconductor device 112, an end on the first terminal 4a side of the first load 2a is in a floating state in which no potential is connected thereto. Accordingly, the output of the first detection circuit 6a becomes Low, as illustrated in the second row and the third column in FIG. 6.

In the semiconductor device 112 of FIG. 3, the power source potential VDD from the second semiconductor chip 8b is to be connected to one end of the second load 2b. On the other hand, the ground potential GND from the inside of the first semiconductor chip 8a is connected to another end of the second load 2b. Accordingly, a potential difference (a second potential difference) is generated on the second load 2b. Accordingly, the output of the second detection circuit 6b becomes High, as illustrated in the third row and the third column in FIG. 6.

As is apparent from FIG. 6, each combination of the output of the first detection circuit 6a with the output of the second detection circuit 6b is in one-to-one correspondence with each chip-stacking topology. Accordingly, it is easy to detect the chip-stacking topology of the semiconductor device 12, 112 based on the output of the first detection circuit 6a and the output of the second detection circuit 6b.

—Signal Path Selection—

The output of the first detection circuit 6a and the output of the second detection circuit 6b are input to the first path selection circuit 36a. Based on the output of the first detection circuit 6a and the output of the second detection circuit 6b, the first path selection circuit 36a controls each switch circuit 38 disposed at the first to fourth paths 46a-46d to select each signal path.

For example, when the output of the first detection circuit 6a is Low and the output of the second detection circuit 6b is Low as depicted on the second column of FIG. 6, the first path selection circuit 36a closes each switch circuit 38 disposed at the first path 46a and the second path 46b (refer to FIG. 4). Further, the first path selection circuit 36a opens each switch circuit 38 disposed at the third path 46c and the fourth path 46d. Namely, the first path selection circuit 36a selects the signal paths 46a, 46b on the surface side. As a result, the first internal circuit 18a is connected to the first electrodes 16a that face the second semiconductor chip 8b.

On the other hand, when the output of the first detection circuit 6a is Low and the output of the second detection circuit 6b is High as depicted on the third column of FIG. 6, the first path selection circuit 36a opens each switch circuit 38 disposed at the first path 46a and the second path 46b (refer to FIG. 5). Further, the first path selection circuit 36a closes each switch circuit 38 disposed at the third path 46c and the fourth path 46d. As a result, the first internal circuit 18a is connected to the second electrodes 16b on the back surface side. Namely, the first path selection circuit 36a selects the signal paths 46c, 46d on the back surface side. As a result, the first internal circuit 18a is connected to the second electrodes 16b that face the second semiconductor chip 8b.

As explained above, based on the output of the first detection circuit 6a and the output of the second detection circuit 6b, the first path selection circuit 36a connects the first internal circuit 18a to electrodes that face the second semiconductor chip 8b, the above electrodes being ones of the first electrodes 16a and the second electrodes 16b.

The first internal circuit 18a receives and transmits each signal through the connected electrodes. Accordingly, when attention is paid on the signal, the first path selection circuit 36a is a circuit that selects an electrode to receive a signal (i.e. a reception electrode) and an electrode to output a signal (i.e. an output electrode) from among a plurality of electrodes disposed at the first face and the second face based on the output of the first detection circuit 6a and the output of the second detection circuit 6b and connects the selected electrodes (i.e. the reception electrode and the output electrode) to the first internal circuit 18a.

As explained above, according to the semiconductor device 12, 112 of Embodiment 1, it is possible to detect a chip-stacking topology and select signal paths based on the chip-stacking topology.

—Reversing Method—

The B2F semiconductor device is obtained by reversing the direction of an upper semiconductor chip (semiconductor chip on the upper side) of the F2F type semiconductor device. There are two methods for reversing the direction of the semiconductor device (direction to which its surface is directed). In a first method, a semiconductor chip is rotated by 180° around an axis parallel to one side of the semiconductor chip (for example, the X-axis in FIG. 4). In a second method, the semiconductor chip is rotated by 180° around an axis parallel to another side of the semiconductor chip (for example, the Y-axis in FIG. 4).

As described earlier, it is easy to detect the chip-stacking topology of the semiconductor device 12, 112 based on the output of the first detection circuit 6a and the output of the second detection circuit 6b. However, it is difficult to detect the reversing method of the semiconductor chip based on the output of the first detection circuit 6a and the output of the second detection circuit 6b.

Accordingly, preferably the reversing method of the semiconductor chip is not changed. For example, the reversing method according to Embodiment 1 is unified to the method of rotating the semiconductor chip by 180° around the X-axis. The same is applied to Embodiments 2 and 3 described later.

(2-2) Signal Processing

As depicted in FIGS. 4 and 5, the second semiconductor chip 8b includes the second internal circuit 18b. The second internal circuit 18b includes, for example, a third input part 40c, a third output part 44c and a second signal processing circuit 42b. The third input part 40c is, for example, an input buffer. The third output part 44c is, for example, an output buffer. The second signal processing circuit 42b is a CPU, a logic circuit, a memory, etc.

The second internal circuit 18b further includes a fourth input part 40d and a fourth output part 44d. The fourth input part 40d is, for example, an input buffer. The fourth output part 44d is, for example, an output buffer.

The second semiconductor chip 8b further includes a plurality of fifth electrodes 16e disposed at a third side having a third face (for example, the surface side) and a plurality of sixth electrodes 16f disposed at a fourth side having a fourth face (for example, the back surface side).

The second semiconductor chip 8b is to be connected to the circuit board 15 on one face side (for example, the back surface side) and also connected to the first semiconductor chip 8a on another face side (for example, the surface side). In the examples depicted in FIGS. 4 and 5, fifth electrodes 16e of the second semiconductor chip 8b are connected to either the first electrodes 16a or the second electrodes 16b of the first semiconductor chip 8a through, for example, solder bumps 11 (for example, micro-bumps). Further, sixth electrodes 16f of the second semiconductor chip 8b are to be connected to electrodes 16s of the circuit board 15 (for example, printed board) through, for example, solder bumps 111.

Each broken line in FIGS. 4 and 5 represents a signal flow. A first signal 70a, which is supplied from the circuit board 15 (for example, printed board) to the semiconductor device 12, 112, is supplied to the second signal processing circuit 42b through the third input part 40c of the second semiconductor chip 8b. The second signal processing circuit 42b processes the first signal 70a to output it to the first semiconductor chip 8a through the third output part 44c.

The first signal 70a output from the second semiconductor chip 8b is supplied to the first signal processing circuit 42a through the input part 40 of the first semiconductor chip 8a. The first signal processing circuit 42a processes the signal to output it to the second semiconductor chip 8b through the output part 44.

A first signal output from the first semiconductor chip 8a (hereafter referred to as a second signal) is supplied to the second signal processing circuit 42b through the fourth input part 40d of the second semiconductor chip 8b. The second signal processing circuit 42b processes the second signal 70b to output to the circuit board 15 through the fourth output part 44d.

(2-3) Control Method

FIG. 7 is a flow chart illustrating a control method performed in the first semiconductor chip 8a.

First, a power source is connected between each power terminal Vdd (refer to FIG. 1) and each ground terminal Vss of the semiconductor device 12, 112, so that power is supplied to the first semiconductor chip 8a and the second semiconductor chip 8b (S2). This connection causes, for example, the supply of the power source potential VDD to the power terminal Vdd and the supply of the ground potential GND to the ground terminal Vss.

Then, the power source potential VDD is connected (supplied) to one end of the first load 2a whose another end is connected to the first terminal 4a disposed at the first face side (for example, the surface side) of the first semiconductor chip 8a (refer to FIGS. 2 and 3) (S4). Further, the ground potential GND, which is different from the power source potential VDD, is connected to one end of the second load 2b whose another end is connected to the second terminal 4b disposed at the second face side (for example, the back surface side) of the first semiconductor chip 8a (S6).

Further, the power source potential VDD or the ground potential GND is connected to the connection terminal 10, which is disposed at the second semiconductor chip 8b on a face side that faces the first semiconductor chip 8a and connected to either the first terminal 4a or the second terminal 4b (S8).

Thereafter, on the basis of potential differences respectively generated on the first load 2a and the second load 2b, the first path selection circuit 36a controls each switch circuit 38 to select a signal path in the first semiconductor chip 8a. The above path selection causes the selection of an electrode to receive signal (i.e. reception electrode) and an electrode to output signal (i.e. output electrode), from among the plurality of electrodes 16a, 16b disposed at a first face (for example, the surface) of the first semiconductor chip 8a and the second face (for example, the back surface) of the first semiconductor chip 8a (S10).

In the above example, the first path selection circuit 36a controls the switch circuit 38 to select the signal path in the first semiconductor chip 8a. However, it is possible to use another method for signal path selection. For example, with the provision of a buffer on each signal path in place of the switch circuit 38, the signal path may be selected by the on/off control of the buffer (the same is applied to Embodiments 2 and 3). In this case, it is possible to omit the buffers of the input part 40 and the output part 44 of the first internal circuit 18a.

(3) Use Method

The semiconductor device 12, 112 of FIGS. 2 and 3 may be used as, for example, a prototype and a device component, as described below.

First, the first semiconductor chip 8a and the second semiconductor chip 8b are manufactured. A F2F type semiconductor device 12 and a B2F type semiconductor device 112 are prototyped using the manufactured first and second semiconductor chips 8a, 8b. The characteristics of the prototypes are measured.

The measured characteristics are compared with specific characteristics (that is, specifications). When there is a semiconductor device that satisfies the specific characteristics, the semiconductor device is mass-produced and used as a device component.

Alternatively, the first semiconductor chip 8a and the second semiconductor chip 8b are designed without the manufacturing thereof. Then, the characteristics of the semiconductor devices 12, 112 are simulated. By the simulation, characteristics of the F2F type semiconductor device 12 and the B2F type semiconductor device 112 are estimated. The estimated characteristics are compared with the specific characteristics. When there is a semiconductor device that satisfies the specific characteristics, the semiconductor device is mass-produced and used as a device component.

(4) 3D-LSI not Detecting Chip-Stacking Topology

Figure 8:
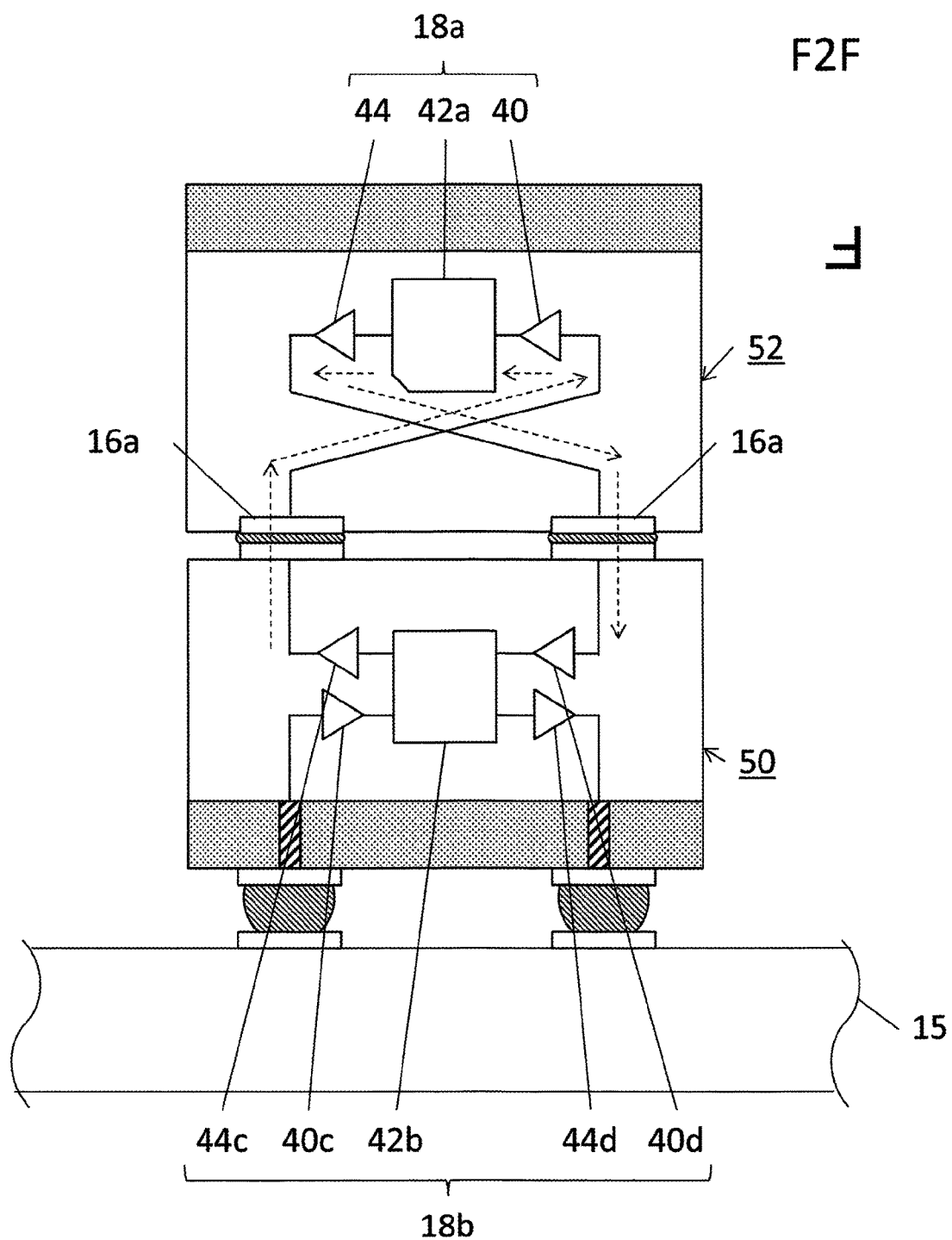
FIG. 8 is a diagram illustrating a 3D-LSI that does not detect a chip-stacking topology.
Figure 9:
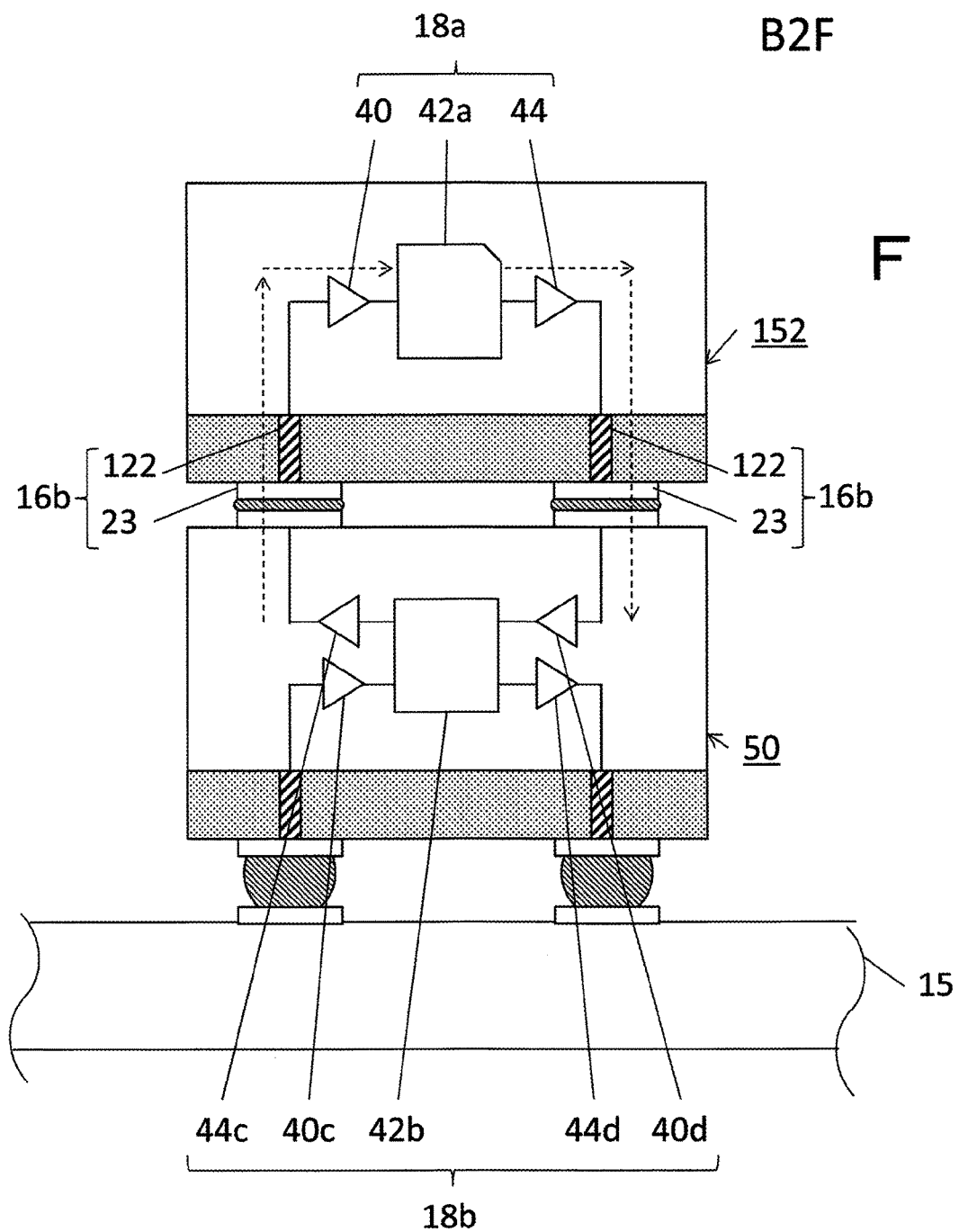
FIG. 9 is a diagram illustrating a 3D-LSI that does not detect a chip-stacking topology.

FIGS. 8 and 9 are diagrams illustrating 3D-LSIs that do not detect a chip-stacking topology. Because the 3D-LSIs depicted in FIGS. 8 and 9 do not detect the chip-stacking topology, they do not perform path selection based on the chip-stacking topology.

The chip-stacking topology of the 3D-LSI depicted in FIG. 8 is F2F. The chip-stacking topology of the 3D-LSI depicted in FIG. 9 is B2F. Each upper chip 52, 152 depicted in FIGS. 8 and 9 includes a first internal circuit 18a, similar to the first semiconductor chip 8a (refer to FIGS. 4 and 5). However, the upper chip 52, 152 does not include the first to second detection circuits 6a, 6b (refer to FIGS. 2 and 3), the first path selection circuit 36a and the switch circuit 38 (refer to FIGS. 4 and 5). Accordingly, the upper chip 52, 152 performs neither chip-stacking topology detection nor path selection.

The first internal circuit 18a of the upper chip 52 (refer to FIG. 8) in the F2F type is connected to the electrodes 16a on the surface side. On the other hand, the first internal circuit 18a of the upper chip 152 (refer to FIG. 9) in the B2F type is connected to the electrodes 16b on the back surface side. Accordingly, each structure of the upper chip 52, 152 is different for each chip-stacking topology.

Each lower chip 50 in FIGS. 8 and 9 includes a second internal circuit 18b, similar to the second semiconductor chip 8b (refer to FIGS. 4 and 5). However, the lower chip 50 does not include the connection terminal 10 (refer to FIGS. 2, 3) to be connected to the power source potential VDD or the ground potential GND.

The characteristics of the 3D-LSI (transmission speed of signal exchanged between the semiconductor chips, the number of terminals that interconnect the semiconductor chips, a minimum supply unit of power, heat dissipation characteristic of the semiconductor chip, etc.) are different depending on the chip-stacking topology. Accordingly, in the development of the 3D-LSI, it is important to evaluate the 3D-LSI characteristics for each chip-stacking topology and select an optimal chip-stacking topology.

However, unless the 3D-LSI is prototyped or simulated for each chip-stacking topology, it is difficult to accurately evaluate the 3D-LSI characteristics.

As described earlier, in the cases depicted in FIGS. 8 and 9, the structures of the upper chips 52, 152 are different for each chip-stacking topology. Accordingly, in the prototyping or the simulation of the 3D-LSIs depicted in FIGS. 8 and 9, a plurality of upper chips 52, 152 of different structures are prototyped or designed. As a result, the development man-hours of the 3D-LSIs of FIGS. 8 and 9 become quite large.

In contrast, in the semiconductor device 12, 112 according to Embodiment 1 (refer to FIGS. 4 and 5) corresponds to the upper chips 52, 152 depicted in FIGS. 8 and 9. Accordingly, according to Embodiment 1, the development man-hours of the 3D-LSIs can be suppressed.

It may be considered to externally control the first semiconductor chip 8a to perform the signal path selection. However, according to Embodiment 1, it is possible to automatically select the signal path with a simple circuit without such external control.

(5) Modified Example (5-1) Modified Example 1

The chip-stacking topologies of the semiconductor devices 12, 112 depicted in FIGS. 2 and 3 are F2F and B2F. However, the chip-stacking topologies of Embodiment 1 may also be F2B and B2B.

The F2B is a chip-stacking topology in which the surface of the upper first semiconductor chip 8a faces the back surface of the lower second semiconductor chip 8b. The B2B is a chip-stacking topology in which the back surface of the upper first semiconductor chip 8a faces the back surface of the lower second semiconductor chip 8b. In other words, the back surface of the second semiconductor chip 8b may face the first semiconductor chip 8a. In this case, the connection terminal 10 is provided on the back surface of the second semiconductor chip 8b.

According to the modified example 1, even in the chip-stacking topologies in which the back surface of the second semiconductor chip 8b faces the first semiconductor chip 8a, the development man-hours of the 3D-LSI may be suppressed.

(5-2) Modified Example 2

Figure 10:
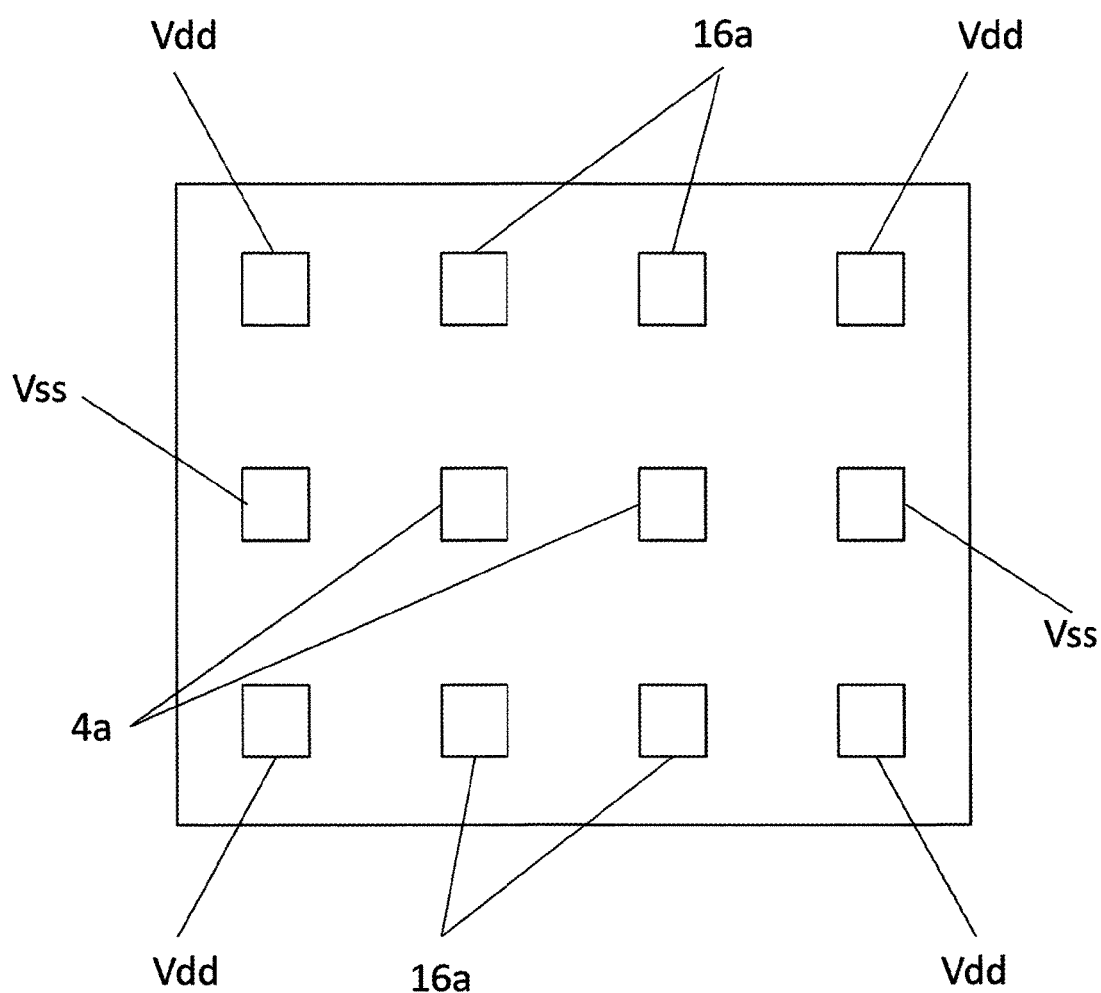
FIG. 10 is a diagram illustrating a modified example 2.
Figure 11:
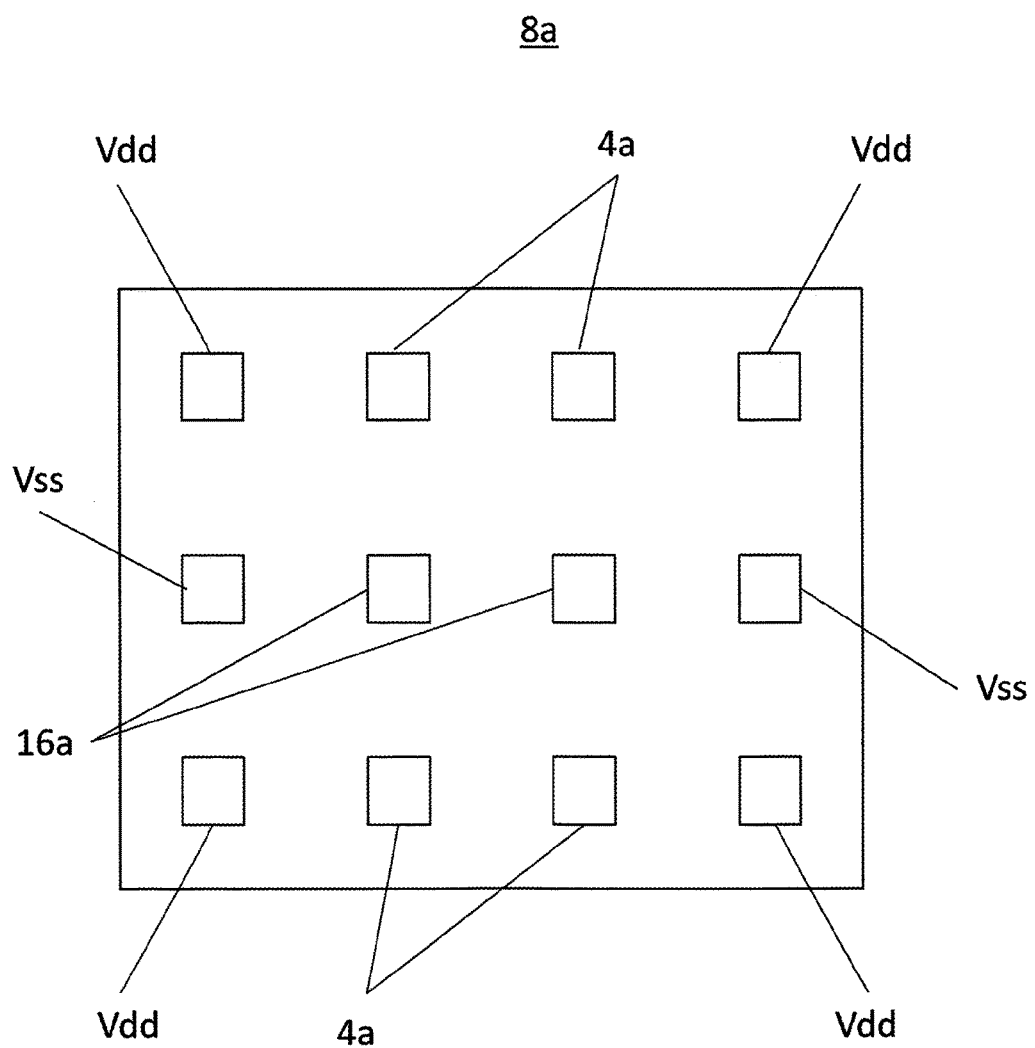
FIG. 11 is a diagram illustrating a modified example 2.

FIGS. 10 and 11 are diagrams illustrating modified examples 2. FIGS. 10 and 11 are plan views of the surface sides of the first semiconductor chips 8a of the modified examples 2.

In the examples depicted in FIGS. 1-3, the first terminal 4a and the second terminal 4b of the first semiconductor chip 8a are disposed at the center of the first semiconductor chip 8a in a plan view. Similarly, the connection terminal 10 of the second semiconductor chip 8b is disposed at the center of the second semiconductor chip 8b in a plan view. Accordingly, when the first semiconductor chip 8a is reversed, the connection terminal 10 of the second semiconductor chip 8b is connected to the first terminal 4a or the second terminal 4b of the first semiconductor chip 8a.

However, the first terminal 4a, the second terminal 4b and the connection terminal 10 may be disposed at places other than the center of the semiconductor chips.

For example, as depicted in FIGS. 10 and 11, a plurality of first terminals 4a may be disposed in one or both of bilateral symmetry and vertical symmetry. Second terminals 4b and a connection terminal 10 are disposed in a similar manner to the first terminals 4a.

Even in such a disposition, the first terminals 4a or the second terminals 4b of the first semiconductor chip 8a and the connection terminal 10 of the second semiconductor chip 8b are connected irrespective of the direction of the first semiconductor chip 8a. Preferably, the first terminals 4a are connected together inside of the first semiconductor chip 8a. The same is applied to the second terminals 4b and the connection terminal 10.

According to the modified examples 2, the variations of terminal disposition (terminal arrangement) in the first semiconductor chip 8a and the second semiconductor chip 8b are increased.

(5-3) Modified Example 3

Figure 12:
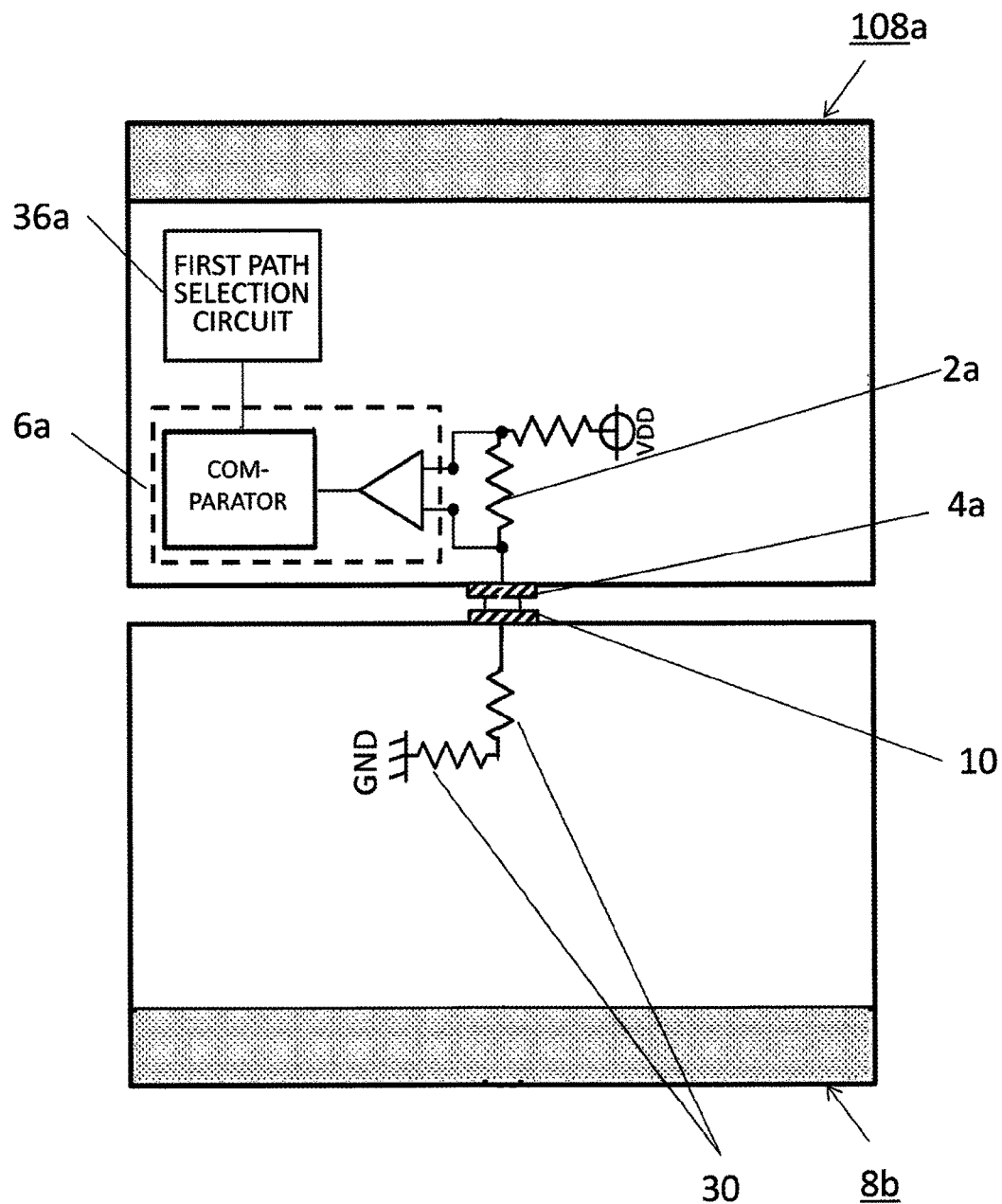
FIG. 12 is a diagram illustrating a modified example 3.

FIG. 12 is a diagram illustrating a modified example 3.

In the modified example 3, a semiconductor device 14 (refer to FIG. 12) is obtained when the second terminal 4b, the second load 2b and the second detection circuit 6b are removed from the first semiconductor chip 8a of the semiconductor device 12 depicted in FIGS. 2 and 3.

The semiconductor device 14 of the modified example 3 includes a first semiconductor chip 108a that includes a first terminal 4a disposed at a first face side (for example, the surface side) having a first face. The first semiconductor chip 108a further includes a first load 2a. A first terminal 4a is connected at one end of the first load 2a, while the power source potential VDD is to be connected at another end, for example.

The first semiconductor chip 108a further includes a first detection circuit 6a. The first detection circuit 6a detects generation of a first potential difference at the first load 2a.

A second semiconductor chip 8b includes a connection terminal 10 disposed at a face side having a face that faces the first semiconductor chip 108a. The connection terminal 10 is connected to the first terminal 4a or faces a second face that is one of faces of the first semiconductor chip 108a and on an opposite side to the first face side having the first face on which the first terminal 4a is disposed. The second semiconductor chip 8b connects a potential (for example, the ground potential GND) different from the power source potential VDD to the connection terminal 10. The first potential difference is a potential difference generated at the first load 2a when the ground potential GND is connected to the first terminal 4a.

Accordingly, when the first terminal 4a is connected to the connection terminal 10, the first detection circuit 6a detects the generation of the first potential difference. On the other hand, the generation of the first potential difference is not detected when the connection terminal 10 faces a second face (for example, the back surface) of the first semiconductor chip 108a so that the first terminal 4a is apart from the connection terminal 10.

Accordingly, according to the semiconductor device 14 of FIG. 12, it is possible to detect a chip-stacking topology. According to the modified example 3, the chip-stacking topology may be detected with a simpler structure than that of the semiconductor devices 12, 112 of FIGS. 1-3.

In the example depicted in FIG. 12, a potential that is to be connected to another end of a first load 2a is the power source potential VDD. However, the potential that is to be connected to another end of a first load 2a may be the ground potential GND. In this case, a potential that is to be connected to the connection terminal 10 of the second semiconductor chip 8b is the power source potential VDD, for example. The first potential difference is a potential difference generated at the first load 2a when the power source potential VDD is connected to the first terminal 4a.

By the way, according to the semiconductor devices 12, 112 of FIGS. 1-3, it is possible to detect a chip-stacking topology whatever the potential of the second semiconductor chip 8b may be (for example, the power source potential VDD).

As explained above, according to Embodiment 1, each combination of the output of the first detection circuit 6a with the output of the second detection circuit 6b varies depending on the chip-stacking topology. Accordingly, the chip-stacking topology of the semiconductor device 12, 112 may be detected.

Further, according to Embodiment 1, the signal path may be selected based on the detected chip-stacking topology. Accordingly, it is possible to suppress the number of semiconductor chip types to be prototyped or designed for the decision of the chip-stacking topology. This enables the suppression of the man-hours in development of the 3D-LSs.

Now, in the semiconductor device 12, 112 depicted in FIGS. 1-3, the chip-stacking topology is detected based on both the output of the first detection circuit 6a and the output of the second detection circuit 6b. However, when the potential of the second semiconductor chip 8b is determined to certain potential (for example, the power source potential VDD or the ground potential GND) as in the modified example 3, it is possible to detect the chip-stacking topology on based on either one of the output of the first detection circuit 6a and the output of the second detection circuit 6b.

For example, when the potential of the second semiconductor chip 8b is determined to the power source potential VDD, the chip-stacking topology may be detected based on the outputs of the second detection circuit 6b (refer to FIGS. 2 and 3 and 6).

Also, in the example depicted in FIGS. 1-3, a potential to be connected through the connection terminal 10 to the first terminal 4a or the second terminal 4b is the power source potential VDD. However, the potential to be connected to the first terminal 4a or the second terminal 4b may be a potential other than the power source potential VDD (for example, the ground potential GND).

Further in the examples depicted in FIGS. 1-3, a terminal not connected to the connection terminal 10 is in a floating state (i.e. a state in which a terminal etc. is connected to nothing), the terminal being the first terminal 4a or the second terminal 4b. However, a constant potential (for example, the power source potential VDD or the ground potential GND) may be connected to the terminal not connected to the connection terminal 10. In this case, the outputs of the first detection circuit 6a and the second detection circuit 6b are different from the outputs depicted in FIG. 6.

Further, in the examples depicted in FIGS. 4 and 5, the first path selection circuit 36a selects an electrode to receive signal and an electrode to output signal from the electrodes disposed at a face that faces the second semiconductor chip 8b, the face being the first face or the second face of the first semiconductor chip 8a. However, each electrode selected by the first path selection circuit 36a is not limited to such an electrode (refer to Embodiment 2).

Embodiment 2

FIGS. 13-16 are diagrams illustrating examples of semiconductor devices 212, 312 according to Embodiment 2. The semiconductor devices 212, 312 resemble the semiconductor devices 12, 112 of Embodiment 1. Accordingly, the descriptions of parts common to Embodiment 1 will be omitted or simplified.

According to Embodiment 2, in a first semiconductor chip 208a, a face for signal reception and a face for signal output may be exchanged based on the chip-stacking topology.

(1) Structure

Figure 13:
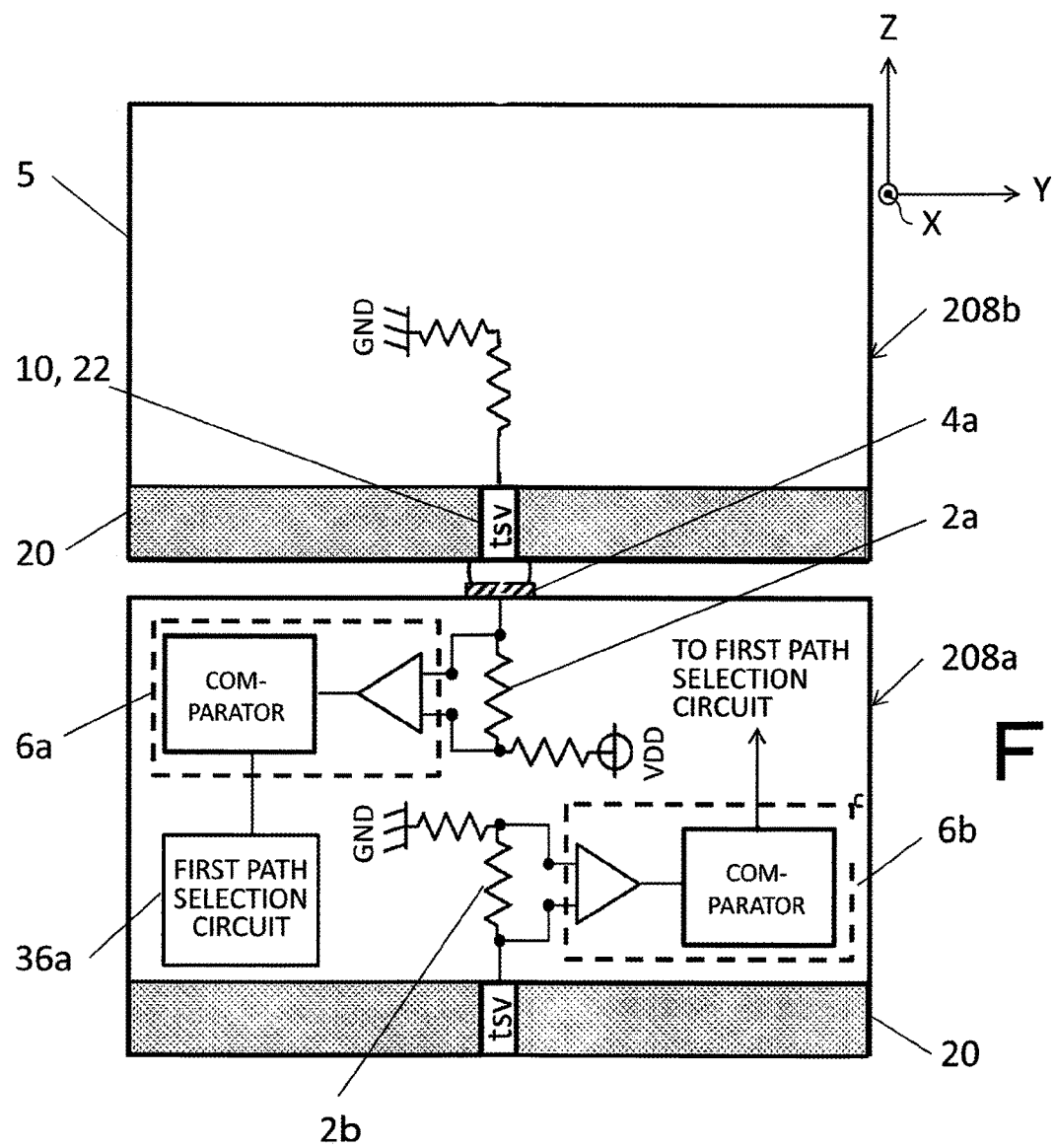
FIG. 13 is a diagram illustrating a semiconductor device according to Embodiment 2.
Figure 14:
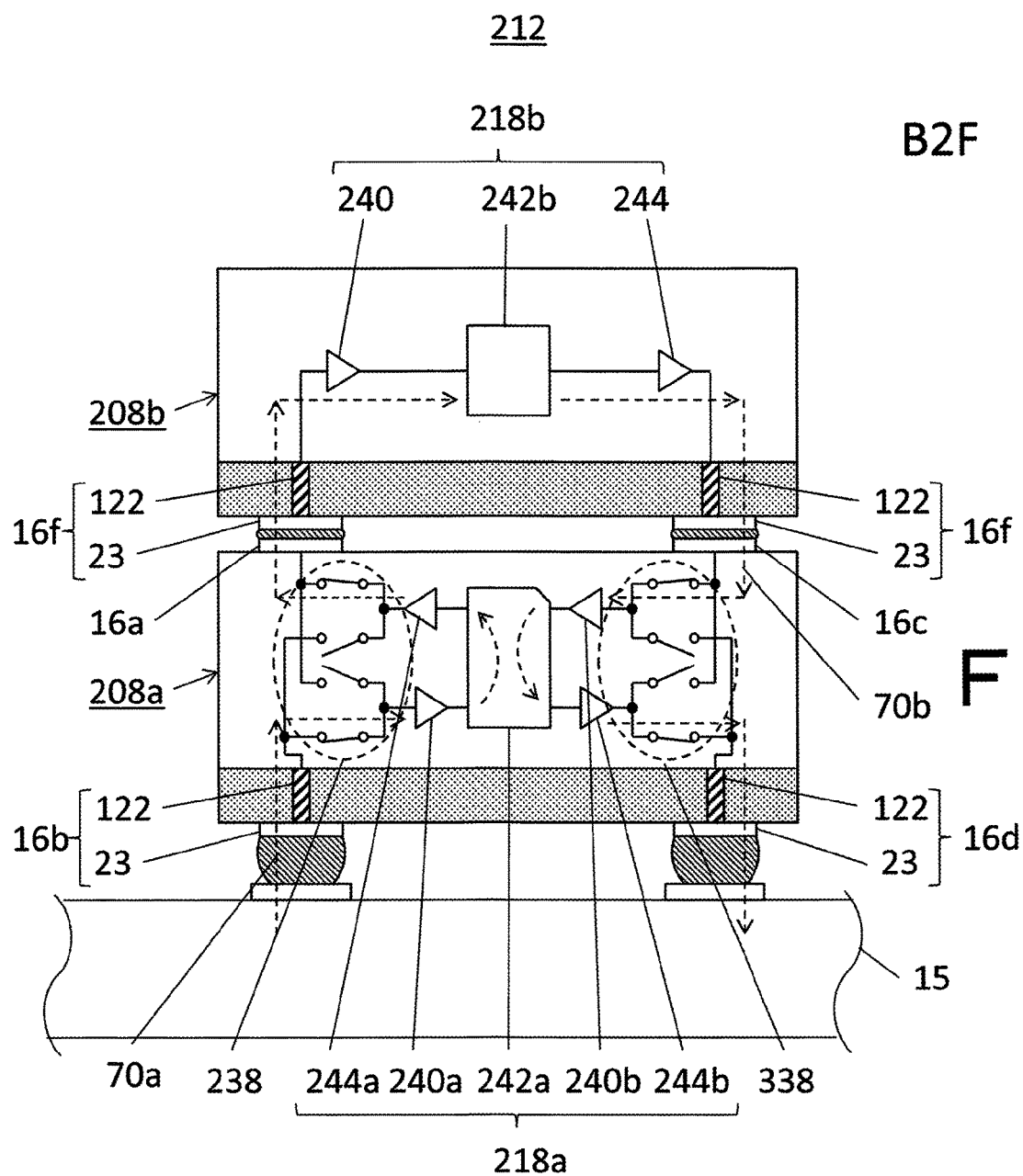
FIG. 14 is a diagram illustrating a semiconductor device according to Embodiment 2.

FIGS. 13 and 14 illustrate sectional views of the semiconductor device 212, chip-stacking topology of which is B2F. In FIG. 13, illustrated is a part of each integrated circuit in the first to second semiconductor chips 208a, 208b. In FIG. 14, illustrated is another part of each integrated circuit in the first to second semiconductor chips 208a, 208b, the part being not depicted in FIG. 13.

Figure 15:
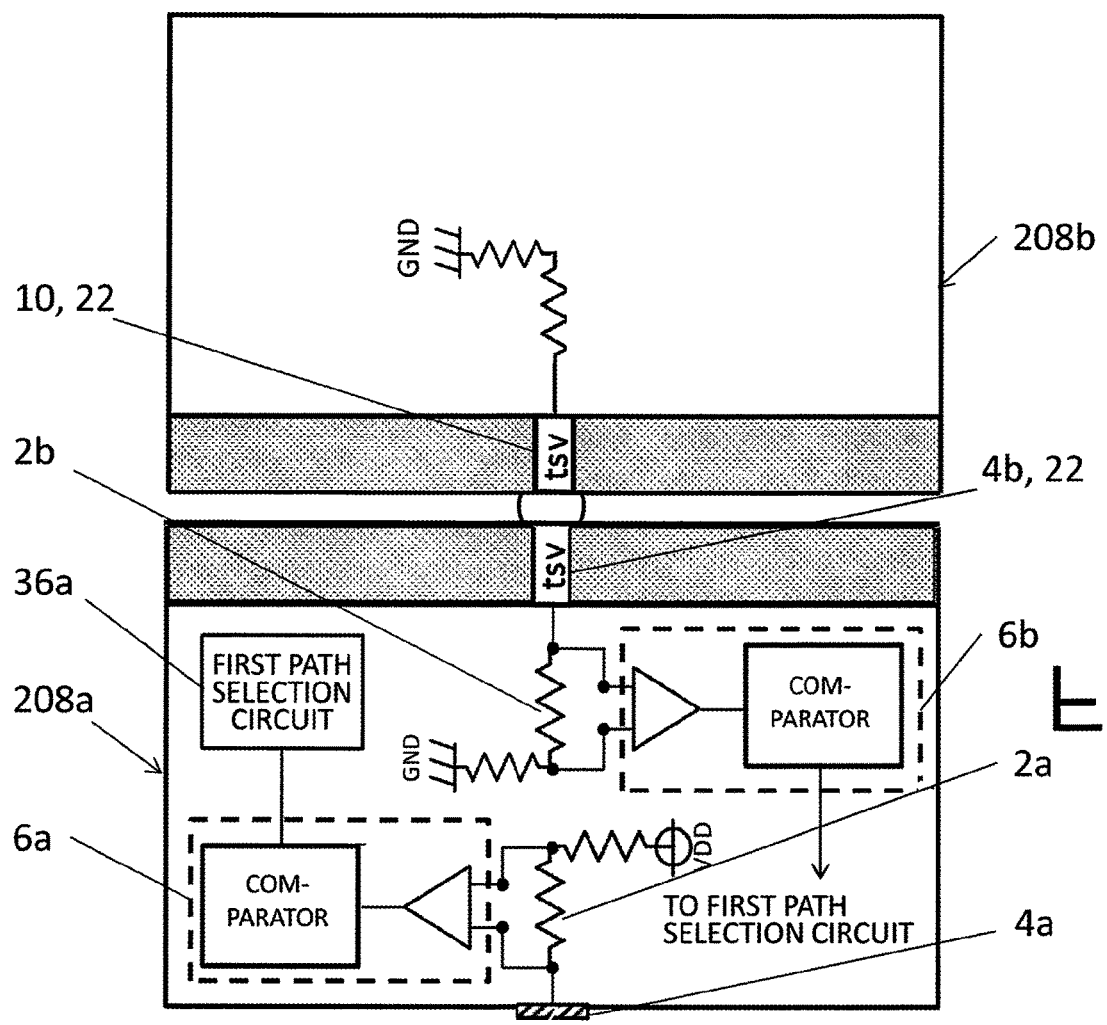
FIG. 15 is a diagram illustrating a semiconductor device according to Embodiment 2.
Figure 16:
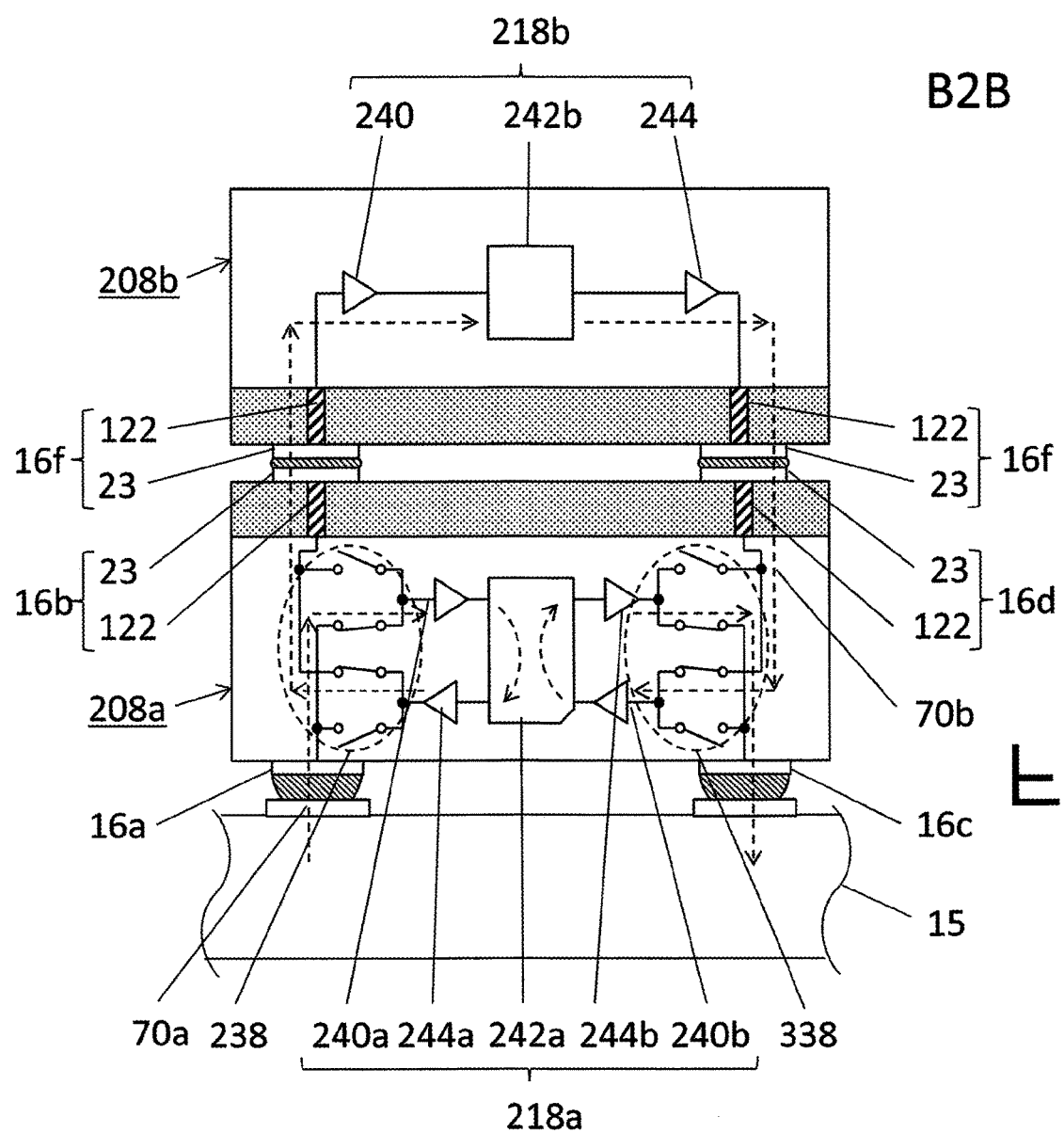
FIG. 16 is a diagram illustrating a semiconductor device according to Embodiment 2.

FIGS. 15 and 16 illustrate sectional views of the semiconductor device 312, chip-stacking topology of which is B2B. In FIG. 15, illustrated is a part of each integrated circuit in the first to second semiconductor chips 208a, 208b. In FIG. 16, illustrated is another part of each integrated circuit in the first to second semiconductor chips 208a, 208b, the part being not depicted in FIG. 15.

The semiconductor device 312 of FIGS. 15 and 16 is obtained by rotating the first semiconductor chip 208a in the semiconductor device 212 of FIGS. 13 and 14 by 180° around a Y-axis that is parallel to the face of the drawing.

In Embodiment 1, the first semiconductor chip 8a (refer to FIGS. 4 and 5) is disposed at the opposite side of the circuit board 15 across the second semiconductor chip 8b.

On the other hand, in Embodiment 2, the first semiconductor chip 208*a* (refer to FIGS. 14 and 16) is disposed between the circuit board 15 and the second semiconductor chip 208*b*.

—First Semiconductor Chip—

The first semiconductor chip 208*a* of Embodiment 2 has almost the same structure as the first semiconductor chip 8*a* of Embodiment 1. Accordingly, descriptions of parts common to the first semiconductor chip 8*a* of Embodiment 1 will be omitted or simplified.

The first semiconductor chip 208*a* (refer to FIGS. 14 and 16) includes a first electrode 16*a* (which corresponds to one of the plurality of first electrodes 16*a* in Embodiment 1) disposed at a first face side having a first face (for example, the surface side). The first semiconductor chip 208*a* further includes a second electrode 16*b* (which corresponds to one of the plurality of second electrodes 16*b* in Embodiment 1) disposed at a second face side having a second face (for example, the back surface side).

Further, the first semiconductor chip 208*a* includes a third electrode 16*c* (which corresponds to another one of the plurality of first electrodes 16*a* in Embodiment 1) disposed at the first face side having the first face (for example, the surface side). The first semiconductor chip 208*a* further includes a fourth electrode 16*d* (which corresponds to another one of the plurality of second electrodes 16*b* in Embodiment 1) disposed at the second face side (for example, the back surface side).

A first internal circuit 218*a* (refer to FIGS. 14 and 16) of the first semiconductor chip 208*a* processes, by a first signal processing circuit 242*a*, a first signal 70*a* received by a first input part 240*a* and thereafter outputs it from a first output part 244*a*. The first internal circuit 218*a* further processes, by the first signal processing circuit 242*a*, a second signal 70*b* received by a second input part 240*b* and thereafter outputs it from a second output part 244*b*.

The first input part 240*a* and the second input part 240*b* are, for example, input buffers. The first output part 244*a* and the second output part 244*b* are, for example, output buffers. The first signal 70*a* is supplied from the circuit board 15, for example. The second signal 70*b* is supplied from the second semiconductor chip 208*b*, for example.

—Second Semiconductor Chip—

The second semiconductor chip 208*b* of Embodiment 2 includes almost the same structure as the second semiconductor chip 8*b* of Embodiment 1.

However, the second semiconductor chip 208*b* includes one input part and one output part, respectively. In practice, a second internal circuit 218*b* of the second semiconductor chip 208*b* receives a signal, which is supplied from the first semiconductor chip 208*a*, by an input part 240. Furthermore, the second internal circuit 218*b* processes, by a second signal processing circuit 242*b*, the received signal and thereafter outputs it through an output part 244 to the first semiconductor chip 208*a*. The input part 240 is, for example, an input buffer. The output part 244 is, for example, an output buffer.

In the examples depicted in FIGS. 13-16, a connection terminal 10 is provided at the back surface side (the semiconductor substrate side). In the examples depicted in FIGS. 13-16, a potential to be connected to a first terminal 4*a* through the connection terminal 10 is the ground potential GND.

(2) Path Selection

—Output of Detection Circuit—

Similar to Embodiment 1, each combination of the output of the first detection circuit 6*a* with the output of the second detection circuit 6*b* is in one-to-one correspondence with the chip-stacking topology. For example, when the chip-stacking topology is B2F (refer to FIG. 13), the output of a first detection circuit 6*a* is High and the output of a second detection circuit 6*b* is Low. On the other hand, when the chip-stacking topology is B2B (refer to FIG. 15), the output of the first detection circuit 6*a* is Low and the output of the second detection circuit 6*b* is Low.

—Path Selection in the Case of B2F—

When the combination of the output of the first detection circuit 6*a* with the output of the second detection circuit 6*b* corresponds to B2F, a first path selection circuit 36*a* controls a switch circuit 238 (refer to FIG. 14) to connect the first input part 240*a* of the first internal circuit 218*a* to the second electrode 16*b* (electrode at the back surface side). The first path selection circuit 36*a* further controls the switch circuit 238 to connect the first output part 244*a* to the first electrode 16*a* (electrode on the surface side).

The first path selection circuit 36*a* further controls a switch circuit 338 to connect the second input part 240*b* to the third electrode 16*c* (electrode on the surface side). The first path selection circuit 36*a* further connects the second output part 244*b* to the fourth electrode 16*d* (electrode at the back surface side).

—Path Selection in the Case of B2B—

When the combination of the output of the first detection circuit 6*a* with the output of the second detection circuit 6*b* corresponds to B2B, the first path selection circuit 36*a* controls the switch circuit 238 (refer to FIG. 16) to connect the first input part 240*a* of the first internal circuit 218*a* to the first electrodes 16*a* (electrode on the surface side). The first path selection circuit 36*a* further controls the switch circuit 238 to connect the first output part 244*a* to the second electrode 16*b* (electrode at the back surface side).

The first path selection circuit 36*a* further controls the switch circuit 338 to connect the second input part 240*b* to the fourth electrode 16*d* (electrode at the back surface side). The first path selection circuit 36*a* further controls the switch circuit 338 to connect the second output part 244*b* to the third electrode 16*c* (electrode on the surface side).

As explained above, the first path selection circuit 36*a* (refer to FIGS. 13 and 15) selects an electrode to receive a first signal 70*a* (i.e. a reception electrode) from one face of the first semiconductor chip 208*a* (refer to FIGS. 14, 16) and thereafter connects the selected electrode (i.e. the reception electrode) to the first input part 240*a* of the first internal circuit 218*a*. The first path selection circuit 36*a* further selects an electrode to output the first signal 70*a* (i.e. an output electrode) from another face of the first semiconductor chip 208*a* and thereafter connect the selected electrode (i.e. the output electrode) to the first output part 244*a* of the first internal circuit 218*a*. The same is applied to the second signal 70*b*.

In short, the first path selection circuit 36*a* selects an electrode to receive a signal from one face and selects an electrode to output it from the other face. Then, the first internal circuit 218*a* exchanges a face to receive a signal (for example, a face to which the first input part 240*a* is connected) with a face to output it (for example, a face to which the first output part 244*a* is connected) according to the chip-stacking topology. Consequently, according to Embodiment 2, the face to receive signal and the face to output it may be exchanged according to the chip-stacking topology.

Now, the first semiconductor chip 208*a* includes a first and a second loads 2*a*, 2*b*, and a first and a second detection circuits 6*a*, 6*b* (refer to FIGS. 13, 15), similar to the first semiconductor chip 8a of Embodiment 1. Accordingly, according to Embodiment 2, a similar effect to Embodiment 1 is obtainable.

(3) Modified Example

Figure 17:
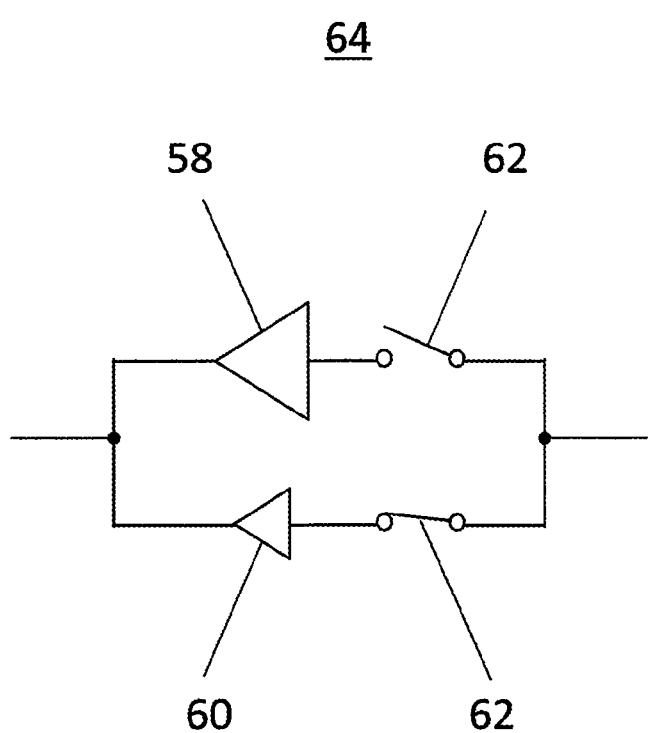
FIG. 17 is a diagram illustrating a modified example of Embodiment 2.

FIG. 17 is a diagram illustrating a modified example of Embodiment 2.

In the aforementioned examples, the first input part 240a to the second output part 244b use the same buffers even when the chip-stacking topology is changed. However, the first input part 240a to the second output part 244b may use different buffers according to the chip-stacking topology.

For example, each of the first input part 240a to the second output part 244b may be a circuit 64 that includes a large capacity buffer 58 (refer to FIG. 17) and a small capacity buffer 60 whose capacity is smaller than the large capacity buffer 58. In this circuit 64, the large capacity buffer 58 and the small capacity buffer 60 are connected in parallel through switches 62.

The first path selection circuit 36a controls each switch 62 to select the small capacity buffer 60 in the circuit 64, when the circuit 64 is connected to an electrode that faces the second semiconductor chip 208b. On the other hand, the first path selection circuit 36a controls each switch 62 to select the large capacity buffer 58 in the circuit 64, when the circuit 64 is connected to an electrode that faces the circuit board 15.

According to the modified example, attenuation of signal that propagates through the circuit board 15 may be compensated by the large capacity buffer 58.

Embodiment 3

Figure 18:
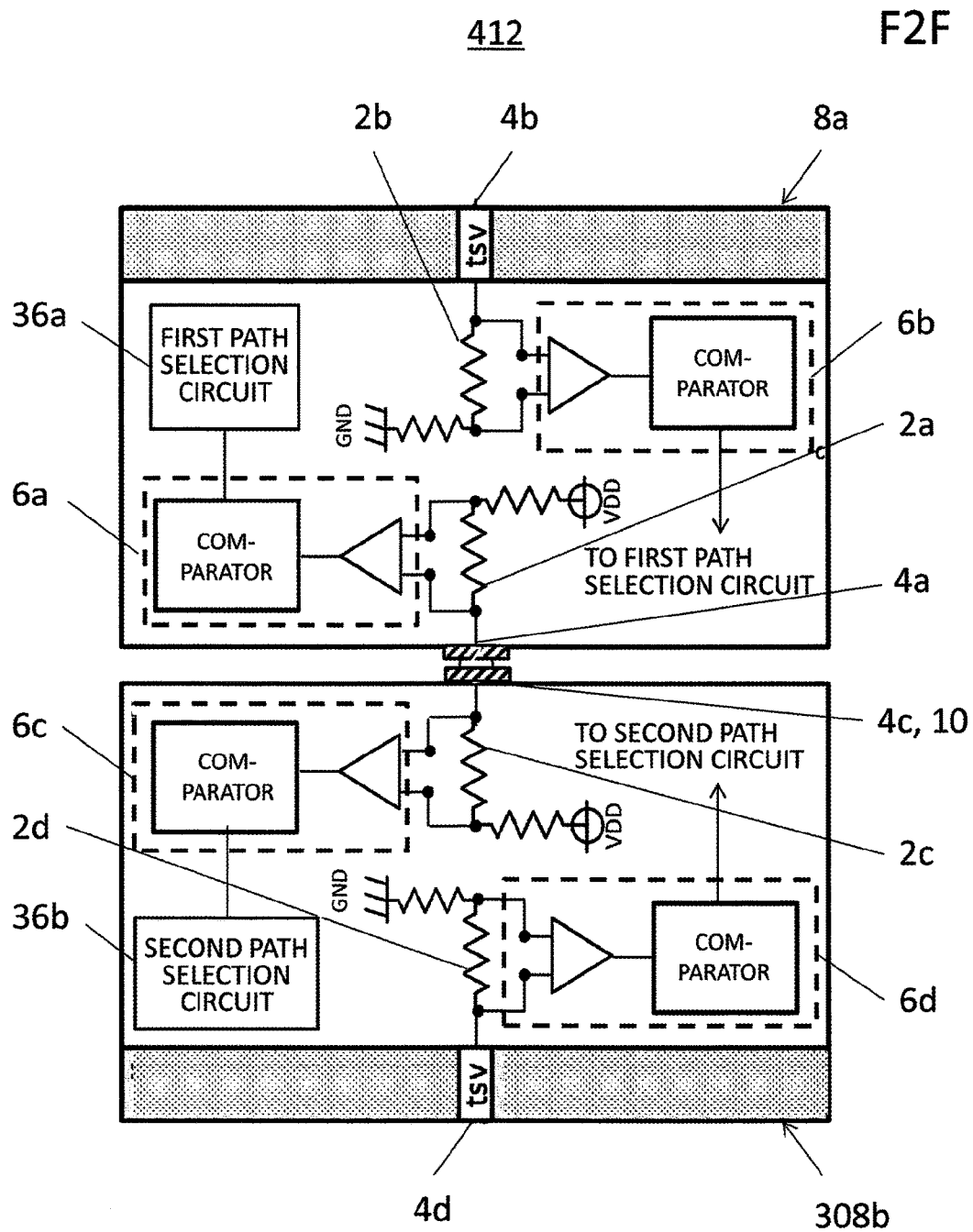
FIG. 18 is a diagram illustrating a semiconductor device according to Embodiment 3.
Figure 19:
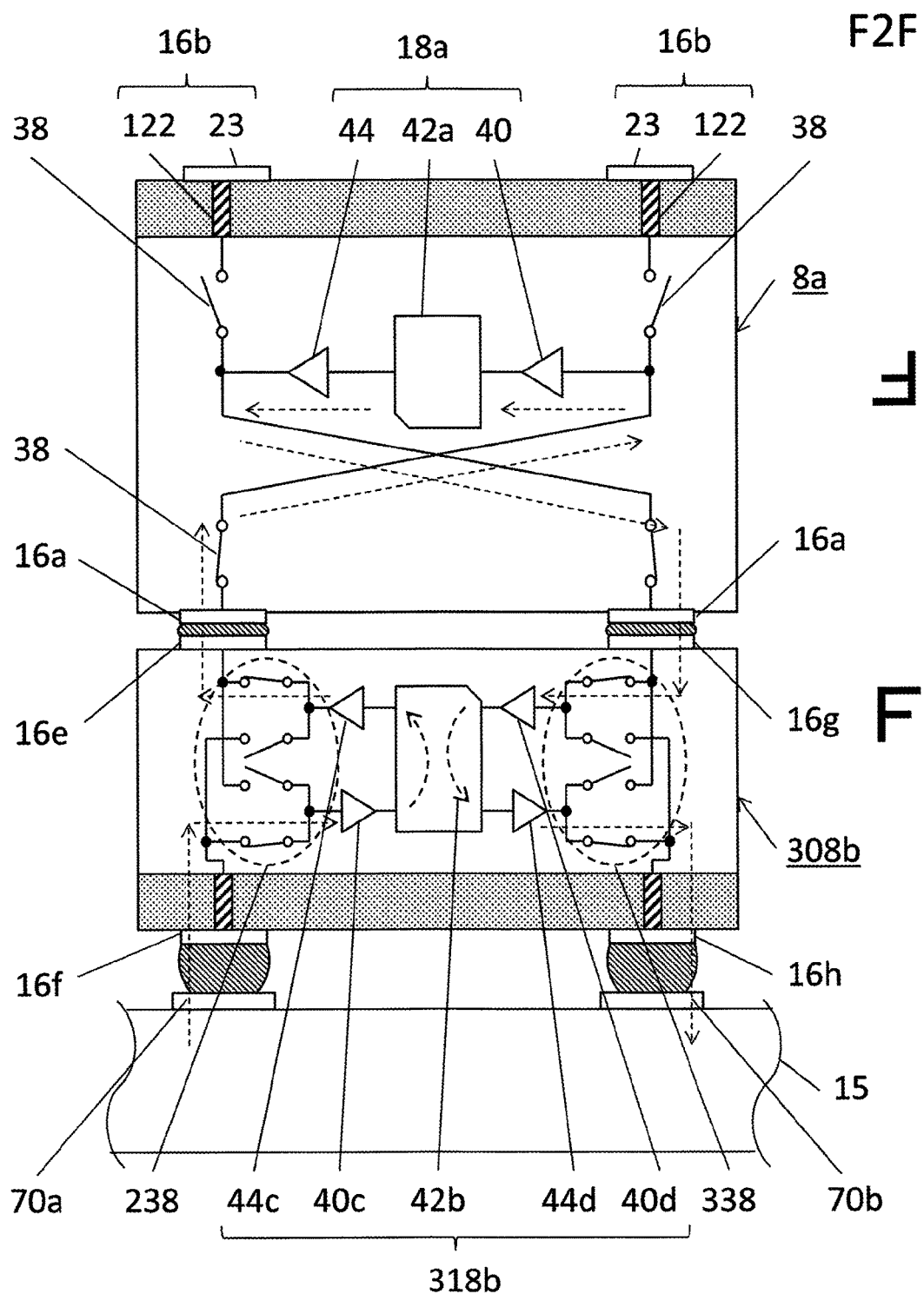
FIG. 19 is a diagram illustrating a semiconductor device according to Embodiment 3.

FIGS. 18 and 19 are sectional views illustrating a semiconductor device according to Embodiment 3. The semiconductor device of Embodiment 3 resembles the semiconductor device of Embodiment 1. Accordingly, the descriptions of parts common to Embodiment 1 is omitted or simplified.

(1) Structure

In the semiconductor devices of Embodiment 1, the first semiconductor chip 8a has individual direction. In contrast, in the semiconductor devices of Embodiment 3, one or both of the first semiconductor chip 8a and the second semiconductor chip 8b has (or have) individual direction. According to Embodiment 3, the variations of detectable chip-stacking topologies increase.

In FIGS. 18 and 19, illustrated are the sectional views of a semiconductor device 412, chip-stacking topology of which is F2F. The chip-stacking topologies of other semiconductor devices (not illustrated) of Embodiment 3 are B2F and F2B, for example.

(1-1) First Semiconductor Chip

A first semiconductor chip 8a of Embodiment 3 is the same as the first semiconductor chip 8a of Embodiment 1 (refer to FIGS. 2 and 4).

(1-2) Second Semiconductor Chip

A second semiconductor chip 308b (refer to FIG. 18) includes a third terminal 4c disposed at a third side (for example, the surface side) having a third face, the terminal 4c being not included in the second semiconductor chip 8b of Embodiment 1 (refer to FIG. 2). The second semiconductor chip 308b further includes a third load 2c whose one end is connected to the third terminal 4c while another end is to be connected to the power source potential VDD.

The second semiconductor chip 308b further includes a fourth terminal 4d (for example, TSV) disposed at a fourth side (for example, the back surface side) having a fourth face so as to face the third terminal 4c, the fourth face being on a side opposite to the third face. The second semiconductor chip 308b further includes a fourth load 2d whose one end is connected to the fourth terminal 4d while another end is to be connected to the ground potential GND.

The second semiconductor chip 308b further includes a third detection circuit 6c that detects generation of a third potential difference at the third load 2c.

The second semiconductor chip 308b further includes a fourth detection circuit 6d that detects generation of a fourth potential difference at the fourth load 2d. Each structure of the third detection circuit 6c and the fourth detection circuit 6d is substantially the same as those of the first detection circuit 6a and the second detection circuit 6b of Embodiment 1.

The third potential difference is generated at the third load 2c when the third terminal 4c is connected to the ground potential GND. The fourth potential difference is generated at the fourth load 2d when the fourth terminal 4d is connected to the power source potential VDD.

—Second Selection Circuit Etc.—

The second semiconductor chip 308b (refer to FIG. 19) further includes a plurality of electrodes 16e-16h disposed at the third face (for example, the surface) and the fourth face (for example, the back surface). The second semiconductor chip 308b further includes a second internal circuit 318b to be connected to the plurality of electrodes 16e-16h and a second path selection circuit 36b (refer to FIG. 18).

For example, the second semiconductor chip 308b (refer to FIG. 19) includes a fifth electrode 16e (which corresponds to one of the plurality of fifth electrodes 16e in Embodiment 1) disposed at the third face side (for example, the surface side). The second semiconductor chip 308b further includes a seventh electrode 16g (which corresponds to another one of the plurality of fifth electrodes 16e in Embodiment 1) disposed at the third face side (for example, the surface side).

The second semiconductor chip 308b further includes a sixth electrode 16f (which corresponds to one of the plurality of sixth electrodes 16f of Embodiment 1) disposed at the fourth face side (for example, the back surface side). The second semiconductor chip 308b further includes an eighth electrode 16h (which corresponds to another one of the plurality of sixth electrodes 16f of Embodiment 1) disposed at the fourth face side (for example, the back surface side).

The second internal circuit 318b (refer to FIG. 18) processes a first signal 70a, which is received by a third input part 40c, by a second signal processing circuit 42b to output it from a third output part 44c. The second internal circuit 318b further processes a second signal 70b, which is received by a fourth input part 40d, by the second signal processing circuit 42b to output it from a fourth output part 44d.

The third input part 40c and the fourth input part 40d are, for example, input buffers. The third output part 44c and the fourth output part 44d are, for example, output buffers. The second path selection circuit 36b is, for example, a logic circuit or a CPU.

Here, the connection terminal 10 (terminal that faces the first semiconductor chip 8a; refer to FIG. 18) is the third terminal 4c or the fourth terminal 4d, the connection terminal 10 being explained in Embodiment 1. A potential to be connected through the connection terminal 10 to the terminal 4a, 4b of the first semiconductor chip 8a is, for example, the power source potential VDD, which is to be connected through the third load 2c to the third terminal 4c. Alternatively, the above potential is the ground potential GND, which is to be connected through the fourth load 2d to the fourth terminal 4d.

(2) Path Selection

—Output of Detection Circuit—

FIGS. 20A and 20B are a diagram illustrating one example of each output of the first to fourth detection circuits 6a-6d depicted in FIG. 18. On each first row of FIGS. 20A and 20B, the chip-stacking topologies of the semiconductor devices of Embodiment 3 are described.

On the second row of FIG. 20A, each output of the first detection circuit 6a of the first semiconductor chip 8a is described. On the third row of FIG. 20A, each output of the second detection circuit 6b of the first semiconductor chip 8a is described.

On the second row of FIG. 20B, each output of the third detection circuit 6c of the second semiconductor chip 308b is described. On the third row of FIG. 20B, each output of the fourth detection circuit 6d of the second semiconductor chip 308b is described.

As is apparent from FIGS. 20A and 20B, when the chip-stacking topologies of prototyped semiconductor devices are limited to three types (for example, F2F, B2F and F2B), it is easy to detect each chip-stacking topology based on the outputs of the first to second detection circuits 6a, 6b. Similarly, when the chip-stacking topologies are limited to three types, it is also easy to detect each chip-stacking topology of the semiconductor device based on the outputs of the third to fourth detection circuits 6c, 6d. Accordingly, the first semiconductor chip 8a and the second semiconductor chip 8b may detect their own chip-stacking topologies. The chip-stacking topology of the prototyped semiconductor device may be limited to three types of B2B, B2F and F2B.

—Signal Path Selection (Refer to FIG. 19)—

In the first semiconductor chip 8a, the first path selection circuit 36a (refer to FIG. 18) selects a signal path. The first path selection circuit 36a selects an electrode to receive signal and an electrode to output signal from the plurality of electrodes 16a, 16b (refer to FIG. 19) based on the output of the first detection circuit 6a and the output of the second detection circuit 6b, to connect the selected electrodes to the first internal circuit 18a.

More specifically, the first path selection circuit 36a connects the input part 40 of the first internal circuit 18a to one electrode that faces the second semiconductor chip 308b based on the output of the first detection circuit 6a and the output of the second detection circuit 6b, the one electrode being one of the first electrodes 16a or the second electrodes 16b. The first path selection circuit 36a further connects the output part 44 of the first internal circuit 18a to another electrode that faces the second semiconductor chip 308b based on the output of the first detection circuit 6a and the output of the second detection circuit 6b, the another electrode being the first electrode 16a or the second electrode 16b.

In the second semiconductor chip 308b, the second path selection circuit 36b (refer to FIG. 18) selects a signal path. The second path selection circuit 36a selects an electrode to receive signal (i.e. a reception electrode) and an electrode to output signal (i.e. an output electrode) from the plurality of electrodes 16e-16h (refer to FIG. 19) based on the output of the third detection circuit 6c and the output of the fourth detection circuit 6d, to connect the selected electrodes (i.e. the reception electrode and the output electrode) to the second internal circuit 318b.

More specifically, the second path selection circuit 36b connects the third input part 40c to an electrode that is disposed at a side opposite to the first semiconductor chip 8a based on the output of the third detection circuit 6c and the output of the fourth detection circuit 6d, the above electrode being the fifth electrode 16e or the sixth electrode 16f. The second path selection circuit 36b further connects the third output part 44c to an electrode that faces the first semiconductor chip 8a based on the output of the third detection circuit 6c and the output of the fourth detection circuit 6d, the above electrode being the fifth electrode 16e or the sixth electrode 16f.

The second path selection circuit 36b further connects the fourth input part 40d to an electrode that faces the first semiconductor chip 8a based on the output of the third detection circuit 6c and the output of the fourth detection circuit 6d, the above electrode being the seventh to eighth electrodes 16g, 16h. The second path selection circuit 36b further connects the fourth output part 44d to an electrode that is disposed at a side opposite to the first semiconductor chip 8a based on the output of the third detection circuit 6c and the output of the fourth detection circuit 6d, the above electrode being the seventh electrodes 16g or the eighth electrodes 16h.

Additionally, the first electrode 16a or the second electrode 16b is connected to the first internal circuit 18a by means of controlling each switch circuit 38 by the first path selection circuit 36a. Similarly, the fifth electrode 16e to the eighth electrode 16h are connected to the second internal circuit 318b by means of controlling switch circuits 238, 338 by the second path selection circuit 36b.

In the above example, the second path selection circuit 36b selects an electrode to receive signal and an electrode to output signal from among the plurality of electrodes 16e-16h, based on the output of the third detection circuit 6c and the output of the fourth detection circuit 6d, to connect the selected electrodes to the second internal circuit 318b. However, the second path selection circuit 36b may select an electrode to receive signal and an electrode to output signal based on one of the output of the third detection circuit 6c and the output of the fourth detection circuit 6d. In this case, detectable chip-stacking topologies may be limited to two types (for example, B2F and F2B).

According to Embodiment 3, both the first semiconductor chip 8a and the second semiconductor chip 308b have the chip-stacking topology detection function and the path selection function. Accordingly, the directions of both first to second semiconductor chips 8a, 308b may be reversed. Consequently, according to Embodiment 3, the variations of detectable chip-stacking topologies increase.

The semiconductor device according to Embodiment 3 includes structure of the semiconductor device of Embodiment 1. Accordingly, according to Embodiment 3, the effect of Embodiment 1 is also obtainable.

In the above description, the embodiments of the present invention are explained. It is to be noted that Embodiments 1-3 are merely exemplary but not limitative.

For example, in Embodiments 1-3, the first internal circuit and the second internal circuit are digital circuits. However, the first internal circuit and the second internal circuit may be analog circuits.

Also, in Embodiments 1-3, the first path selection circuit is a different circuit from the first internal circuit. However, the first path selection circuit may be a part of the first internal circuit. The same is applied to the second path selection circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first semiconductor chip including
      a first terminal disposed at a first face side having a first face,
      a first load whose one end is connected to the first terminal, another end of the first load being to be connected to a power source potential,
      a second terminal disposed at a second face side having a second face so as to face the first terminal, the second face being on an side opposite to the first face,
      a second load whose one end is connected to the second terminal, another end of the second load being to be connected to a ground potential different from the power source potential,
      a first detection circuit that detects generation of a first potential difference at the first load, and
      a second detection circuit that detects generation of a second potential difference at the second load; and
   a second semiconductor chip including
      a connection terminal disposed at a face side having a face and connected to the first terminal or the second terminal, the face facing the first semiconductor chip; wherein
   the power source potential or the ground potential is to be connected through the connection terminal to the first terminal or the second terminal;
   wherein the first potential difference is a potential difference generated at the first load when the first terminal is connected to a potential different from the power source potential, and
   the second potential difference is a potential difference generated at the second load when the second terminal is connected to a potential different from the ground potential.

2. The semiconductor device according to claim 1, wherein the first semiconductor chip further includes:
   a plurality of electrodes disposed at the first face and the second face;
   a first internal circuit to be connected to the plurality of electrodes; and
   a first path selection circuit that selects, from among the plurality of electrodes, a reception electrode to receive signal and an output electrode to output signal, on a basis of one or both of an output of the first detection circuit and an output of the second detection circuit, to connect the reception electrode and the output electrode to the first internal circuit.

3. The semiconductor device according to claim 1, wherein the second semiconductor chip includes:
   a third terminal disposed at a third face side having a third face,
   a third load whose one end is connected to the third terminal, another end of the third load being to be connected to the power source potential,
   a fourth terminal disposed at a fourth face side having a fourth face so as to face the third terminal, the fourth face being on a side opposite to the third face,
   a fourth load whose one end is connected to the fourth terminal, another end of the fourth load being to be connected to the ground potential,
   a third detection circuit that detects generation of a third potential difference at the third load,
   a fourth detection circuit that detects generation of a fourth potential difference at the fourth load;
   the third potential difference is a potential difference generated at the third load when the third terminal is connected to the ground potential;
   the fourth potential difference is a potential difference generated at the fourth load when the fourth terminal is connected to the power source potential; and
   the connection terminal is the third terminal or the fourth terminal.

4. The semiconductor device according to claim 3, wherein the second semiconductor chip further includes:
   a plurality of electrodes disposed at the third face and the fourth face;
   a second internal circuit to be connected to the plurality of electrodes; and
   a second path selection circuit that selects, from among the plurality of electrodes, a reception electrode to receive signal and an output electrode to output signal, on a basis of one or both of an output of the third detection circuit and an output of the fourth detection circuit, to connect the reception electrode and the output electrode to the second internal circuit.

5. The semiconductor device according to claim 1, wherein the first terminal and the second terminal are disposed at a center of the first semiconductor chip in a plan view; and
   the connection terminal is disposed at a center of the second semiconductor chip in a plan view.

6. The semiconductor device according to claim 2, wherein the first path selection circuit selects the reception electrode to receive signal and the output electrode to output signal respectively from electrodes disposed at a face that faces the second semiconductor chip, to connect the reception electrode and the output electrode to the first internal circuit, the face being the first face or the second face.

7. The semiconductor device according to claim 2, wherein the first path selection circuit selects the reception electrode to receive signal from one face of the first semiconductor chip, to connect the reception electrode to an input part of the first internal circuit and further selects the output electrode to output signal from another face of the first semiconductor chip to connect the output electrode to an output part of the first internal circuit.

8. A semiconductor device comprising:
a first semiconductor chip including
  a first terminal disposed at a first face side having a first face,
  a first load whose one end is connected to the first terminal, another end of the first load being to be connected to a power source potential, and
  a first detection circuit that detects generation of a first potential difference at the first load; and
a second semiconductor chip including
  a connection terminal connected to the first terminal or facing a second face on a side opposite to the first face, the second face being one of faces of the first semiconductor chip, wherein
  a ground potential different from the power source potential is to be connected to the connection terminal;
wherein the first potential difference is a potential difference generated at the first load when the ground potential is connected to the first terminal.

9. A control method for a semiconductor device that includes: a first semiconductor chip including a first terminal disposed at a first face side having a first face, a first load whose one end is connected to the first terminal, another end of the first load being to be connected to a power source potential, a second terminal disposed at a second face side having a second face so as to face the first terminal, the second face being on an side opposite to the first face, a second load whose one end is connected to the second terminal, another end of the second load being to be connected to a ground potential different from the power source potential; and a second semiconductor chip including a connection terminal disposed at a face side having a face and connected to the first terminal or the second terminal, the face facing the first semiconductor chip, wherein the power source potential or the ground potential is to be connected through the connection terminal to the first terminal or the second terminal; the control method comprising:
  detecting generation of a first potential difference at the first load by a first detection circuit included in the first semiconductor chip, the first potential difference being a potential difference generated at the first load when the first terminal is connected to a potential different from the power source potential; and
  detecting generation of a second potential difference at the second load by a second detection circuit included in the first semiconductor chip, the second potential difference being a potential difference generated at the second load when the second terminal is connected to a potential different from the ground potential.

* * * * *